(12) United States Patent
Shirasaka et al.

(10) Patent No.: US 7,290,448 B2
(45) Date of Patent: Nov. 6, 2007

(54) PHYSICAL QUANTITY SENSOR, LEAD FRAME, AND MANUFACTURING METHOD THEREFOR

(75) Inventors: Kenichi Shirasaka, Shizuoka-ken (JP); Masayoshi Omura, Shizuoka-ken (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/220,816

(22) Filed: Sep. 8, 2005

(65) Prior Publication Data

US 2006/0053909 A1 Mar. 16, 2006

(30) Foreign Application Priority Data

Sep. 10, 2004 (JP) ........................ P 2004-263881
Dec. 24, 2004 (JP) ........................ P2004-374105

(51) Int. Cl.
*G01P 1/02* (2006.01)
(52) U.S. Cl. ..................................................... 73/493
(58) Field of Classification Search ................... 73/493
See application file for complete search history.

(56) References Cited

U.S. PATENT DOCUMENTS 4,485,548 A * 12/1984 Janisiewicz ................ 29/566.3
5,866,818 A * 2/1999 Sumi et al. ............... 73/514.33
6,035,712 A * 3/2000 Ohta et al. ..................... 73/493
6,115,261 A * 9/2000 Platt et al. .................. 361/760
2004/0103530 A1* 6/2004 Adachi et al. ................ 29/854
2006/0012364 A1* 1/2006 Tamura ....................... 324/246

FOREIGN PATENT DOCUMENTS

| JP | H09-292408 | 11/1997 |
| JP | 2002-156204 | 5/2002 |
| JP | 2004-125778 | 4/2004 |
| JP | 2004-128473 | 4/2004 |

\* cited by examiner

*Primary Examiner*—Robert Raevis
(74) *Attorney, Agent, or Firm*—Dickstein, Shapiro, LLP.

(57) ABSTRACT

A physical quantity sensor is constituted using a lead frame having at least one stage and a plurality of leads whose bases are arranged in the same plane, wherein at least one physical quantity sensor chip having a plurality of electrode pads is mounted on the stage and is inclined so that the electrode pads are disposed in the inclination direction and are connected to the leads by use of wires whose lengths substantially match distances between the electrode pads and leads. This prevents the leads and wires from being unexpectedly broken, and it is possible to avoid the occurrence of separation of the leads from the physical quantity sensor chip. In addition, the tip ends of the leads are disposed along the surface of the inclined stage before wire bonding; hence, it is possible to easily connect the tip ends of the leads to the physical quantity sensor chip.

11 Claims, 18 Drawing Sheets

PHYSICAL QUANTITY SENSOR, LEAD FRAME, AND MANUFACTURING METHOD THEREFOR

BACKGROUND OF THE INVENTION

1. Field of the Invention

This invention relates to physical quantity sensors for detecting physical quantities such as magnetism, pressure, and acceleration as well as bearing and direction of magnetism and gravitation. The present invention also relates to lead frames used for physical quantity sensors and to manufacturing methods for manufacturing physical quantity sensors using lead frames.

This application claims priority on Japanese Patent Applications Nos. 2004-263881 and 2004-374105, the contents of which are incorporated herein by reference.

2. Description of the Related Art

Recently, portable terminal devices such as portable telephones (e.g., cellular phones) have been equipped with GPS functions (where GPS stands for "Global Positioning System") for detecting user's positional information, which is displayed on the screen of a display. GPS functions can be associated with other functions for precisely detecting geomagnetism and acceleration, whereby it is possible to detect bearings (or azimuths), directions, and movements within the three-dimensional space surrounding portable terminal devices held by users.

In order for portable terminal devices to have the aforementioned functions, it is necessary to incorporate physical quantity sensors such as magnetic sensors and acceleration sensors into portable terminal devices. In order to realize detection of bearing and acceleration within the three-dimensional space, it is necessary to use physical quantity sensor chips, which are incorporated into portable terminal devices and whose bases should be inclined by prescribed angles.

Various types of physical quantity sensors having the aforementioned functions have been developed. One type of known physical quantity sensor is a magnetic sensor, which detects magnetism but whose base is not inclined. This magnetic sensor is constituted by a first magnetic sensor chip, which is mounted on the surface of a substrate and is sensitive to magnetic factors of an external magnetic field lying in two directions (i.e., X-axis and Y-axis directions), which cross each other at a right angle therebetween along the surface of the substrate, and a second magnetic sensor chip, which is mounted on the surface of the substrate and is sensitive to a magnetic factor of the external magnetic field lying in a direction (i.e., a Z-axis direction) vertically perpendicular to the surface of the substrate. That is, the magnetic sensor measures geomagnetism factors as vectors in the three-dimensional space with reference to magnetic factors that are respectively detected by a pair of the magnetic sensor chips.

The aforementioned magnetic sensor is set up in such a way that the second magnetic sensor chip vertically stands on the surface of the substrate. This increases the total thickness (i.e., the height lying in the Z-axis direction) of the magnetic sensor. As the total thickness should be reduced to as small as possible, it is preferable to use the foregoing types of physical quantity sensors whose bases are inclined, which are disclosed in Japanese Unexamined Patent Publication No. 2004-125778, Japanese Unexamined Patent Publication No. 2004-128473, Japanese Unexamined Patent Publication No. 2002-156204, and Japanese Unexamined Patent Publication No. H09-292408, for example.

Physical quantity sensors in which physical quantity sensor chips are inclined have an outstanding advantage in that the total thickness thereof can be reduced while securing satisfactory sensitivity. For example, Japanese Unexamined Patent Publication No. H09-292408 discloses an acceleration sensor (or a physical quantity sensor) having a one-sided beam structure in which an acceleration sensor chip (or a physical quantity sensor chip) is inclined in advance with respect to a substrate; hence, even when a sensor package is mounted on the surface of the substrate, it is possible to secure a high sensitivity in a prescribed axial direction matching the inclined direction and to reduce a sensitivity in other axial directions including directions lying along the surface of the substrate.

As described above, physical quantity sensors in which physical quantity sensor chips are inclined to each other may realize mainstream technology in the future because they can reduce the total thickness to as small as possible, and they have various advantages due to inclination of chips.

FIG. 12 shows an example of a physical quantity sensor (or a magnetic sensor) in which physical quantity sensor chips are inclined to each other. Specifically, a magnetic sensor 50 of FIG. 12 is constituted by a pair of magnetic sensor chips (or physical quantity sensor chips) 51 and 52, a plurality of leads 53 for electrically connecting the magnetic sensor chips 51 and 52 to an external device, and a resin mold package 54 for integrally fixing them. The magnetic sensor chips 51 and 52 are each inclined with respect to a lower surface (or a bottom) 54a of the resin mold package 54.

In a manufacturing method of the magnetic sensor 50, the magnetic sensor chips 51 and 52 are respectively bonded onto stages 55 and 56; then, wiring using wires 57 is performed with respect to the magnetic sensor chips 51 and 52 and the leads 53. After the completion of the wiring, the stages 55 and 56 are subjected to inclination.

In the magnetic sensor 50, substantially the same length is set to the wires 57 irrespective of distances between the leads 53 and surfaces 51a and 52a of the magnetic sensor chips 51 and 52. Herein, bonding is basically performed with reference to short distances lying between the leads 53 and the surfaces 51a and 52a of the magnetic sensor chips 51 and 52. In that case, when the stages 55 and 56 are subjected to inclination, any unwanted load is applied to wires used for relatively long distances between them. This may unexpectedly break the wires 57 and may likely cause separation of the wires 57 from the surfaces 51a and 52a of the magnetic sensor chips 51 and 52. In contrast, when bonding is basically performed with reference to long distances lying between the leads 53 and the surfaces 51a and 52a of the magnetic sensor chips 51 and 52, the wires 57 may be loosened and may come into contact with each other so as to cause a short-circuit, wherein the wires 57 are likely to be exposed onto the surface of the resin mold package 54.

SUMMARY OF THE INVENTION

It is an object of the present invention to provide a physical quantity sensor and a manufacturing method therefor, wherein leads are not easily broken and are not easily separated from surfaces of physical quantity sensor chips.

It is another object of the present invention to provide a physical quantity sensor, a lead frame therefore, and a manufacturing method therefore, wherein it is possible to easily avoid the occurrence of electric connection failure between leads and physical quantity sensor chips.

In a first aspect of the present invention, a physical quantity sensor is constituted by a plurality of leads whose base portions are arranged in a same plane, and at least one physical quantity sensor chip in which a plurality of electrode pads (or bonding pads) are formed and which is inclined to the plane, wherein the electrode pads are disposed in an inclination direction of the physical quantity sensor chip and are respectively connected to the leads via wires whose lengths substantially match distances between the electrode pads and the leads. As the electrode pads and the leads are connected together using the wires whose lengths substantially match the distances therebetween, a long distance is wired with a relatively long wire, and a short distance is wired with a relatively short wire; hence, it is possible to reduce load applied to the wires.

In the above, tip ends of the leads, which are subjected to wire bonding, have different heights substantially matching heights of the electrode pads on the physical quantity sensor that is inclined. This makes it possible for the wires to have appropriate lengths; hence, it is possible to efficiently perform wire bonding.

A manufacturing method of the physical quantity sensor includes a lead frame forming step for forming a lead frame including a frame portion, at least one stage being surrounded by the leads, and a plurality of interconnection portions for interconnecting the stage to the frame portion, a bonding step for bonding the physical quantity sensor chip onto the stage, a wire bonding step for performing wire bonding to connect the leads to the electrode pads on the physical quantity sensor chip mounted on the stage by use of the wires whose lengths substantially match the distances between the electrode pads and the leads, and a physical quantity sensor chip inclining step for inclining the stage together with the physical quantity sensor chip at a prescribed angle to the frame portion while deforming interconnection portions. Herein, before the physical quantity sensor chip is bonded onto the stage that is inclined, the lengths of the wires are appropriately controlled in response to the distances between the electrode pads and the leads; hence, it is possible to reduce load applied to the wires when the stage is inclined together with the physical quantity sensor chip. In addition, the wire bonding is performed using the wires in a moving direction of the electrode pads on the physical quantity sensor chip that is inclined. This makes it possible to reduce stress applied to the wires in advance; that is, the physical quantity sensor chip moves in a bonding direction of the wires when the physical quantity sensor chip is inclined; hence, it is possible to reliably prevent the wires from being unexpectedly broken.

In the above, the physical quantity sensor chip can be inclined together with the stage before the wire bonding, wherein it is possible to additionally introduce a lead processing step in which the leads are processed such that the heights of the tip ends thereof are changed in conformity with the positions of the electrode pads as the physical quantity sensor chip is inclined. In other words, before the stage is actually inclined, the heights of the tip ends of the leads are changed in advance in response to the positions of the electrode pads attached onto the physical quantity sensor chip that is to be inclined. In such a wire bonding manner, it is possible to reduce stress applied to the wires before the inclination of the physical quantity sensor chip.

The manufacturing method can be partially modified to include a lead frame forming step for forming a lead frame including a frame portion, at least one stage surrounded by the leads, and a plurality of interconnection portions for interconnecting the stage to the frame portion, a bonding step for bonding the physical quantity sensor chip onto the stage, a physical quantity sensor chip inclining step for inclining the stage together with the physical quantity sensor chip at a prescribed angle to the frame portion while deforming the interconnection portions, and a wire bonding step for performing wire bonding to connect the leads to the electrode pads on the physical quantity sensor chip mounted on the stage by use of the wires whose lengths substantially match the distances between the electrode pads and the leads. As the wire bonding is performed after the inclination of the physical quantity sensor chip, it is possible to provide the wires having appropriate lengths. In addition, it is possible to additionally introduce a lead processing step, in which the leads are processed such that the heights of the tip ends thereof are changed in response to the positions of the electrode pads on the physical quantity sensor chip that is inclined, between the lead frame forming step and the physical quantity sensor chip inclining step. That is, the leads are processed; then, the physical quantity sensor chip is inclined; then, the wire bonding is performed using the wires with respect to the leads whose heights substantially match the positions of the electrode pads. This reduces the distances between the electrode pads and the leads as well as the lengths of the wires; hence, it is possible to control the wires having appropriate lengths, and it is possible to reliably prevent the wires from being unexpectedly broken. Furthermore, it is possible to avoid the occurrence of separation of the wires from the electrode pads.

In a second aspect of the present invention, a lead frame comprises at least one stage for mounting a physical sensor chip thereon, a frame having a plurality of leads that are arranged around the stage, and a plurality of interconnection portions for interconnecting the stage to the frame, wherein base portions of the leads that are separated from the stage are disposed substantially in a prescribed plane, the stage is inclined with respect to the prescribed plane, and the tip ends of the leads are disposed along the surface of the stage. In the manufacturing, the physical quantity sensor chip is mounted on the surface of the stage; then, wire bonding is performed such that the tip ends of the leads are electrically connected to bonding pads formed on the surface of the physical quantity sensor chip via wires. Thereafter, an assembly of the lead frame and physical quantity sensor chip is held between metal molds having cavities (i.e., resin forming spaces), into which a melted resin is injected, thus forming a resin mold package for integrally fixing the lead frame and physical quantity sensor chip.

In the above, the surfaces of the tip ends of the leads are disposed in the same plane substantially matching the surface of the stage; hence, they are arranged in parallel with the bonding pads of the physical quantity sensor chip mounted on the stage. Thus, it is possible to easily perform wire bonding so as to connect the tip ends of the leads to the bonding pads respectively via wires. After completion of the wire bonding, it is unnecessary to change the distances between the tip ends of the leads and the bonding pads; hence, it is possible to prevent stress from being applied to the wires and the physical quantity sensor chip.

In the manufacturing method of a physical quantity sensor, in a preparation step, a thin metal plate is processed into a lead frame including at least one stage for mounting a physical quantity sensor chip thereon, a frame having a plurality of leads that are arranged around the stage, and a plurality of interconnection portions for interconnecting the stage to the frame; in a stage inclining step, the stage is inclined with respect to the frame while deforming the interconnection portions; in a lead processing step, the leads are processed such that the tip ends thereof are disposed in an inclination direction of the stage; in a bonding step, the physical quantity sensor chip is bonded onto the stage; and in a wiring step, the tip ends of the leads are electrically connected to the physical quantity sensor, wherein both of the stage inclining step and the lead processing step are simultaneously performed in press working. That is, before the bonding step and wiring step, the stage is subjected to inclination, and the leads are disposed in the inclination direction of the stage, whereby in the condition in which the leads are electrically connected to the physical quantity sensor chip, which is attached onto the stage, via wires, the stage does not move relative to the frame; hence, in the manufacturing of the physical quantity sensor, it is possible to reliably prevent stress from being applied to the physical quantity sensor chip and the wires. As the stage inclining step and lead processing step are simultaneously performed in press working, the tip ends of the leads can be easily arranged at prescribed heights substantially matching heights of bonding pads of the physical quantity sensor chip in a short period of time. As the tip ends of the leads are disposed in the stage inclination direction, it is possible to minimize the distances between the leads and the surface of the physical quantity sensor chip attached onto the stage. Therefore, in the wiring step, it is possible to reduce the lengths of the wires for electrically connecting the leads to the physical quantity sensor chip.

In the above, in the bonding step and wiring step, there is provided an instrument that collectively support backsides of the stage, leads, and frame in the condition in which the stage and the tip ends of the leads are respectively maintained in inclined states. That is, in the bonding step and wiring step, it is possible to reliably prevent the stage and leads from being deformed; hence, it is possible to perform bonding of the physical quantity sensor chip onto the stage in a stable manner, and it is possible to electrically connect the leads to the physical quantity sensor chip in a stable manner.

In addition, it is possible to form a plurality of stages with respect to the lead frame in the preparation step; it is possible to perform wire bonding such that the tip ends of the leads to the surface of the physical quantity sensor chip via wires in the wiring step; and it is also possible to move the lead frame such that a capillary is directed to be substantially perpendicular to each of the stages and the tip ends of the leads in the wiring step. That is, in the wiring step, the lead frame is appropriately inclined or moved in conformity with the inclination angle of each stage, whereby the capillary is directed to be substantially perpendicular to each stage and each physical quantity sensor chip. This makes it easy to perform setup of the device used for the wire bonding, i.e., setup for arrangement of the capillary.

Furthermore, the bonding step is performed using a die-bonding tape having at least two physical quantity sensor chips, which are then simultaneously bonded onto the corresponding stages. That is, the bonding step can be performed easily by simply arranging the die-bonding tape onto the consecutive stages even though these stages have different inclination angles with respect to the frame, wherein plural physical quantity sensor chips can be simultaneously attached onto plural stages with ease. The die-bonding tape offers a good precision for determining relative positions of plural physical quantity sensor chips, which are respectively attached onto plural stages having different inclination angles with respect to the frame.

The lead frame used for the manufacturing of a physical quantity sensor is formed by processing a thin metal plate to have a frame portion having a planar surface, from which a plurality of leads project inwardly towards a physical quantity sensor chip, wherein the tip ends of the leads, which are arranged to encompass the physical quantity sensor chip, are disposed in a prescribed plane that is inclined to the planar plane at a prescribed angle. Herein, the physical quantity sensor chip has a plurality of projection electrodes used for establishing electric connection with the tip ends of the leads. That is, the physical quantity sensor chip and the leads can be mutually connected to each other by simply attaching the projection leads onto the surfaces of the leads. As the physical quantity sensor chip is inclined with respect to the frame portion in the condition in which it is brought into contact with the leads, it is possible to prevent stress from being applied to the projection electrodes at which the physical quantity sensor chip is electrically connected to the tip ends of the leads.

In the manufacturing of a physical quantity sensor, a thin metal plate is processed into a lead frame including a frame portion, from which a plurality of leads project inwardly towards a physical quantity sensor chip having a plurality of projection electrodes thereon, in a preparation step; the tip ends of the leads, which are connected to the physical quantity sensor chip, are inclined in a prescribed direction with respect to the frame portion in a lead processing step; and the tip ends of the leads are bonded to the projection electrodes of the physical quantity sensor chip in a bonding-wiring step. That is, by simply bringing the projection electrodes of the physical quantity sensor chip into contact with the tip ends of the leads, it is possible to reliably incline the physical quantity sensor chip with respect to the frame portion; hence, it is possible to electrically connect the leads to the physical quantity sensor chip. As the leads are disposed in the inclination direction before the bonding-wiring step, the tip ends of the leads would not be moved relative to the frame portion in the condition in which the leads are connected to the physical quantity sensor chip. Therefore, it is possible to reliably prevent stress from being applied to the projection electrodes at which the physical quantity sensor chip is connected to the tip ends of the leads.

In the above, there is provided an instrument for collectively supporting the backsides of the leads and the frame portion in the bonding-wiring step in the condition in which the tip ends of the leads are maintained in an inclined state. This makes it possible to prevent the leads from being unexpectedly deformed in the bonding-wiring step; hence, it is possible to establish setup and electric connection with regard to the physical quantity sensor chip in a stable manner.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1:
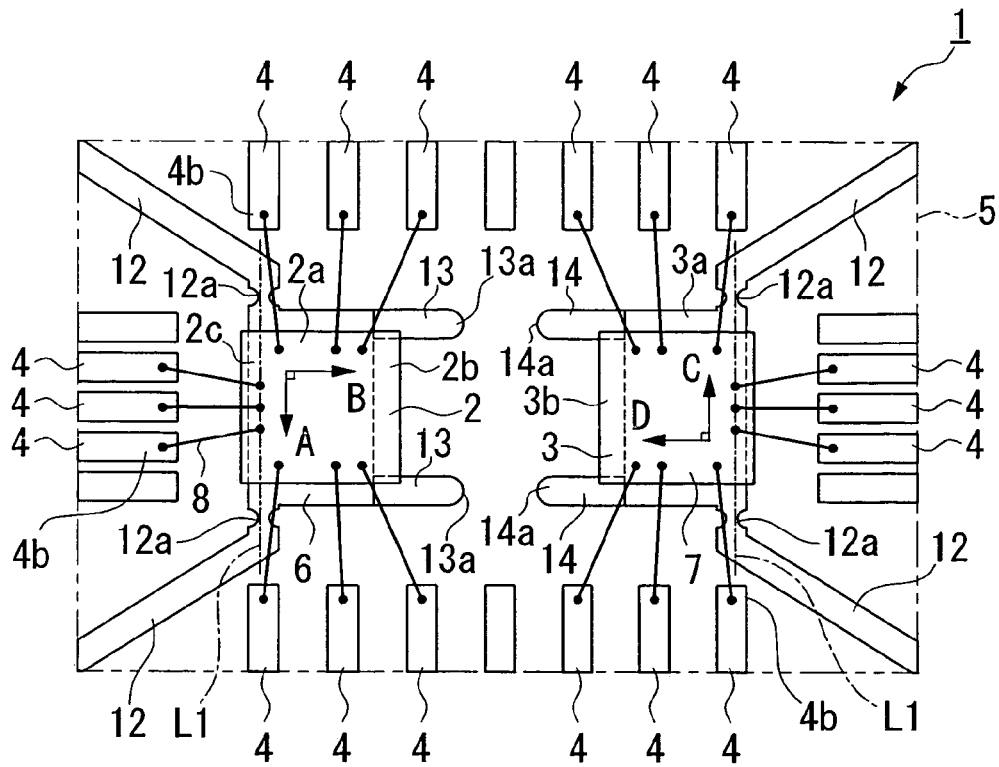
FIG. 1 is a plan view showing the overall structure of a magnetic sensor, which is manufactured in accordance with a first embodiment of the present invention.

A physical quantity sensor (or a magnetic sensor), which is produced by way of a manufacturing method in accordance with a first embodiment of the present invention, will be described with reference to FIGS. 1 and 2. Specifically, a magnetic sensor 1 is designed to detect direction and magnitude (or intensity) of an external magnetic field and is constituted by a pair of magnetic sensor chips (or physical sensor chips) 2 and 3 having electrode pads (or bonding pads) 20a-20c on the surfaces thereof, a plurality of leads 4 whose terminal ends are arranged in the same plane and which electrically connect the magnetic sensor chips 2 and 3 to an external device (not shown), and a resin mold package 5 that integrally fixes the magnetic sensor chips 2 and 3 together with the terminal ends of the leads 4.

Each of the magnetic sensor chips 2 and 3 has a rectangular plate-like shape in a plan view, wherein they are respectively mounted on stages 6 and 7. The magnetic sensor chips 2 and 3 are embedded in the resin mold package 5 in such a way that they are arranged higher than the leads 4 and close to an upper surface 5c of the resin mold package 5. The magnetic sensor chips 2 and 3 are respectively inclined with respect to a lower surface 5a of the resin mold package 5, which corresponds to the plane for arranging the leads 4. In addition, upper ends 2b and 3b of the magnetic sensor chips 2 and 3 are directed towards the upper surface 5c of the resin mold package 5. Furthermore, a surface 2a of the magnetic sensor chip 2 is inclined to form a plane lying in a direction A-B (hereinafter, simply referred to as an A-B plane), while a surface 3a of the magnetic sensor chip 3 is inclined to form a plane lying in a direction C-D (hereinafter, simply referred to as a C-D plane), wherein the A-B plane crosses the C-D plane at an acute angel θ therebetween.

The magnetic sensor 2 is sensitive to magnetic factors of the external magnetic field lying in two directions; that is, it has two sensing directions corresponding to directions A and B, which cross at a right angle along the surface 2a.

The magnetic sensor 3 is sensitive to magnetic factors of the external magnetic field lying in two directions; that is, it has two sensing directions corresponding to directions C and D, which cross at a right angle along the surface 3a.

In the above, both of the directions A and C lie in parallel with an axis L1 (which will be described later), wherein they are inverse to each other. Both of the directions B and D lie perpendicular to the axis L1, wherein they are inverse to each other.

Figure 3:
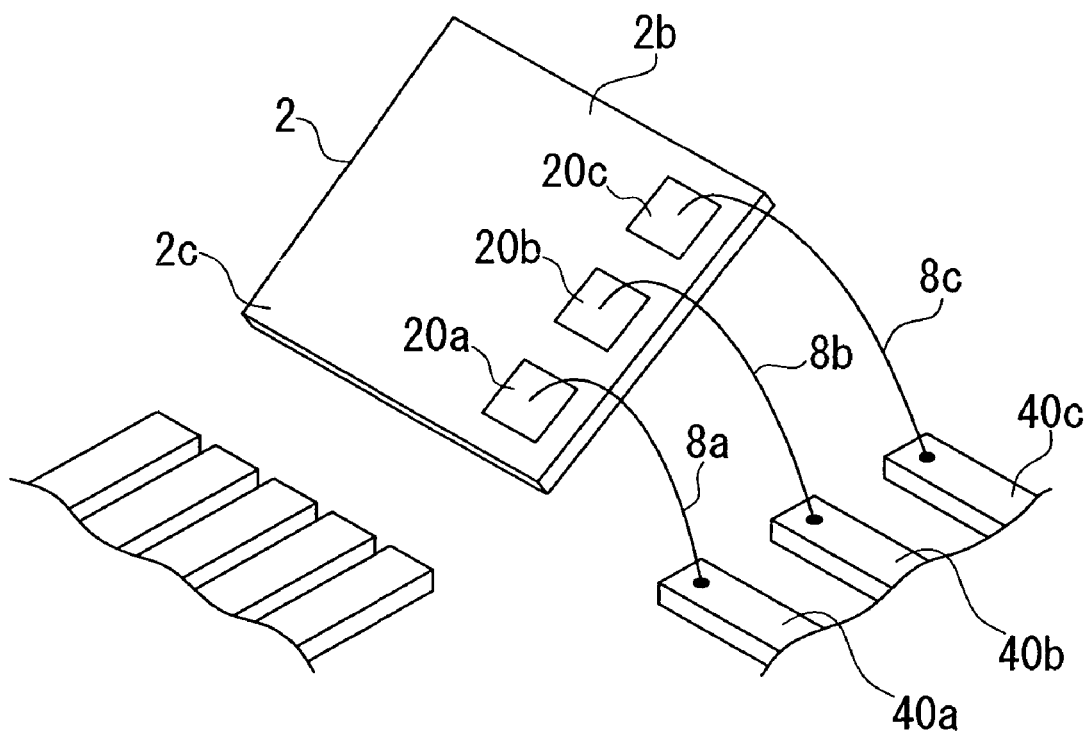
FIG. 3 is an enlarged perspective view showing relationships between electrode pads and leads, which are respectively connected together via wires.

As shown in FIG. 3, a plurality of electrode pads 20a, 20b, and 20c are formed on the surface 2a of the magnetic sensor chip 2 and are disposed in an inclination direction lying from a lower end 2c to an upper end 2b of the magnetic sensor chip 2. The magnetic sensor chip 2 is inclined about a support axis corresponding to a lower end 2c thereof.

The leads 4 are each composed of a metal material such as copper, wherein backsides 4a of the leads 4 are exposed onto the lower surface 5a of the resin mold package 5. Tip ends 4b of the leads 4 are electrically connected to the magnetic sensor chips 2 and 3 via metallic wires 8, wherein connected portions therebetween are embedded inside of the resin mold package 5. Specifically, as shown in FIG. 3, three leads 40a, 40b, and 40c are disposed in the inclination direction of the magnetic sensor chip 2, wherein the lead 40a is connected to the electrode pad 20a via a wire 8a; the lead 40b is connected to the electrode pad 20b via a wire 8b; and the lead 40c is connected to the electrode pad 20c via a wire 8c.

Figure 2:
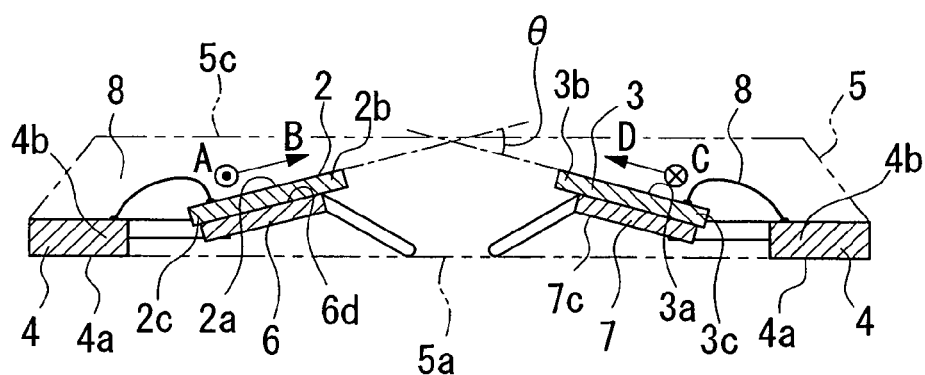
FIG. 2 is a transverse cross-sectional view of the magnetic sensor shown in FIG. 1.

In the condition in which the magnetic sensor chip 2 is inclined as shown in FIG. 2, the electrode pad 20c is arranged at a position forming a longest distance from the lead 40c. Distances between electrode pads and leads are gradually reduced in an order of the electrode pads 20b and 20a, which are respectively connected to the leads 40b and 40a. Thus, it is possible to determine lengths of the wires 8 in conformity with distances between the electrode pads 20a, 20b, and 20c and the leads 40a, 40b, and 40c, in the inclined condition of the magnetic sensor chip 2. That is, bonding is performed using the wires 8 whose lengths are reduced in the order of the wires 8a, 8b, and 8c; that is, the wire 8a has a shortest length. The lengths of the wires 8a, 8b, and 8c are substantially identical to the distances between the electrode pads 20a, 20b, and 20c and the leads 40a, 40b, and 40c.

Lengths of wires connecting between electrode pads and leads, which are disposed in an inclination direction lying from a lower end 3c to an upper end 3b of the magnetic sensor chip 3, are appropriately determined similarly to the magnetic sensor chip 2 including the electrode pads 20a, 20b, and 20c and the wires 8a, 8b, and 8c (see FIG. 3).

Next, a manufacturing method of the magnetic sensor 1 will be described.

Figure 4:
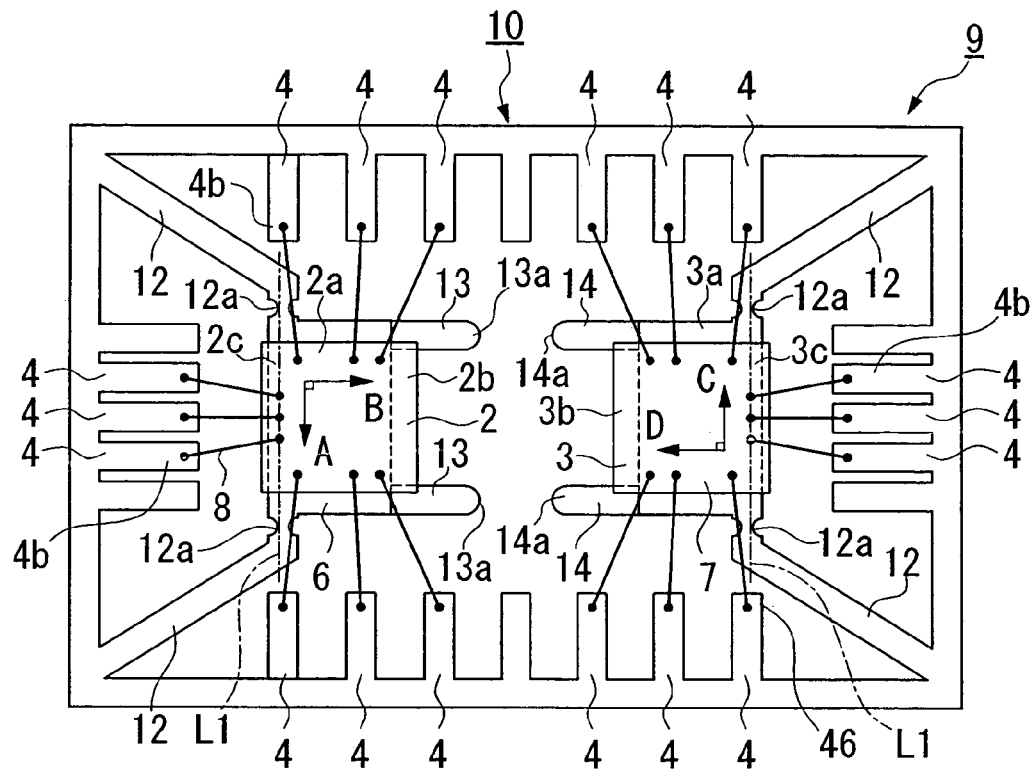
FIG. 4 is a plan view showing the magnetic sensor of FIG. 1 in which magnetic sensor chips are mounted on a lead frame.
Figure 5:
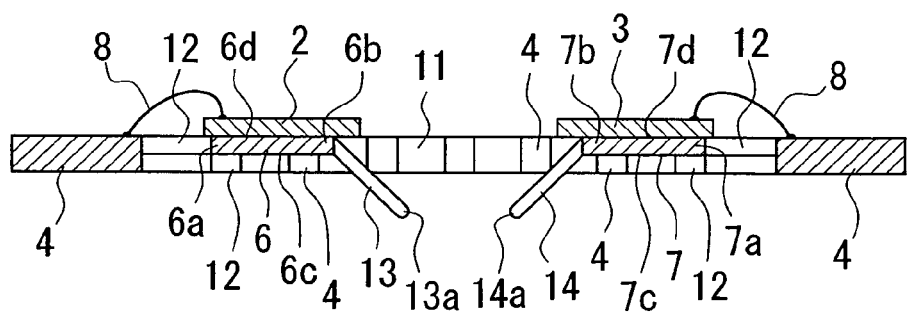
FIG. 5 is a transverse cross-sectional view of the magnetic sensor shown in FIG. 4.

First, a thin metal plate is prepared and is subjected to either press working or etching or both of press working and etching, thus forming a lead frame 10 in which stages 6 and 7 are supported by a frame 9 as shown in FIGS. 4 and 5.

The frame 9 is constituted by a rectangular frame portion 11, which is formed in a rectangular shape encompassing the stages 6 and 7 in a plan view, and a plurality of leads 4 and 12, which are extended inwardly from the rectangular frame portion 11.

The leads 12 serve as hanging leads for fixing the stages 6 and 7 to the rectangular frame portion 11, wherein the four leads 12 have four ends 12a, which are interconnected to both ends of a first terminal 6a of the stage 6 and both ends of a first terminal 7a of the stage 7 respectively. Herein, when the stages 6 and 7 are arranged in a prescribed direction, both ends of the first terminal 6a lie in a width direction of the stage 6 perpendicular to the prescribed direction, and both ends of the first terminal 7a lie in a width direction of the stage 7 perpendicular to the prescribed direction.

The four ends 12a of the four leads 12 each have cutouts (e.g., recesses) at prescribed portions thereof, which are reduced in thickness compared with other portions thereof. This forms twisting portions that can be easily deformed and twisted about axial lines L1, which are drawn to connect both ends of the first terminals 6a and 7a of the stages 6 and 7 when the stages 6 and 7 are subjected to inclination.

A pair of projections 13 are formed to project from a second terminal 6b of the stage 6, wherein they are bent in a backside 6c of the stage 6; Similarly, a pair of projections 14 are formed to project from a second terminal 7b of the stage 7, wherein they are bent in a backside 7c of the stage 7. These projections 13 and 14 are formed for the purpose of inclining the stages 6 and 7, wherein they are each formed as slender rods. In addition, the projections 13 of the stage 6 are extended mutually opposite to the projections 14 of the stage 7.

Specifically, a pair of the projections 13 of the stage 6 and a pair of the projections 14 of the stage 7 are arranged with prescribed distances therebetween in the area (or space) between the second terminals 6b and 7b of the stages 6 and 7. This reliably avoids the occurrence of supply failure of a resin used for the formation of a resin mold package. In order to achieve precise inclination of the stages 6 and 7 in a stable manner, it is preferable to increase the distances between the projections 13 and the projections 14.

Tip ends 13a of the projections 13 are each formed in a semi-spherical shape in order to minimize the exposure thereof onto the lower surface of the resin mold package. Similarly, tip ends 14a of the projections are each formed in a semi-spherical shape in order to minimize the exposure thereof onto the lower surface of the resin mold package.

Prescribed parts such as the stages 6 and 7, which are arranged in the internal area encompassed by the leads 4 within the lead frame 10 having the aforementioned structure, are each reduced in thickness by way of photo-etching compared with other parts of the lead frame 10. For example, they are reduced in dimensions so as to realize approximately a half of the thickness set to the other parts of the lead frame 10. The photo-etching is performed before a thin metal plate is subjected to press working; thus, it is possible to reliably prevent the leads 12 and the backsides 6c and 7c of the stages 6 and 7 from being exposed onto the lower surface of the resin mold package 5.

Now, the aforementioned lead frame 10 is provided in a lead frame forming step; then, the magnetic sensor chips 2 and 3 are bonded onto surfaces 6d and 7d of the stages 6 and 7 in a bonding step; and the magnetic sensor chips 2 and 3 and the leads 4 are electrically connected together via wires 8 in a wire bonding step.

Figure 6:
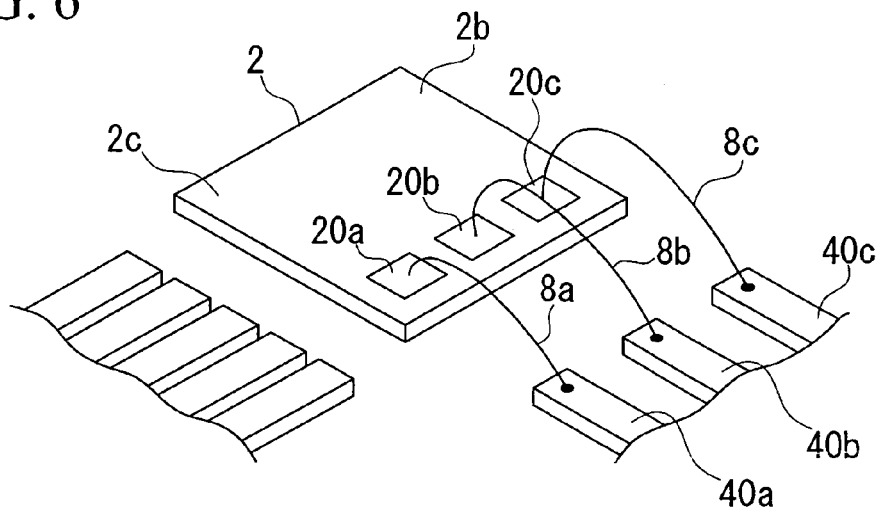
FIG. 6 is an enlarged perspective view showing relationships between electrode pads and leads, which are respectively connected together via wires.

As to the wire bonding using the wires 8, the traveling path of a capillary (not shown) is greatly varied so that as shown in FIG. 6, the wire 8a has a shortest length, and lengths of other wires 8b and 8c are increased in turn, wherein the wires 8 are increased in supply so as to perform wire bonding such that the wires 8a, 8b, and 8c are respectively wired from the electrode pads 20a, 20b, and 20c to the leads 40a, 40b, and 40c. Herein, the wires 8a, 8b, and 8c are subjected to bonding in prescribed directions substantially matching a moving direction of the electrode pads 20a, 20b, and 20c, which are moved due to the inclination of the magnetic sensor chips 2 and 3.

In the above, the lengths of the wires 8a, 8b, and 8c, while different from one another, are respectively substantially identical to the distances between the electrodes 20a, 20b, and 20c and the leads 40a, 40b, and 40c. This guarantees that the wires are controlled to have appropriate lengths not causing partial exposure of the wires onto the surface (or backside) of a resin after a resin sealing step, which will be described later.

Figure 7:
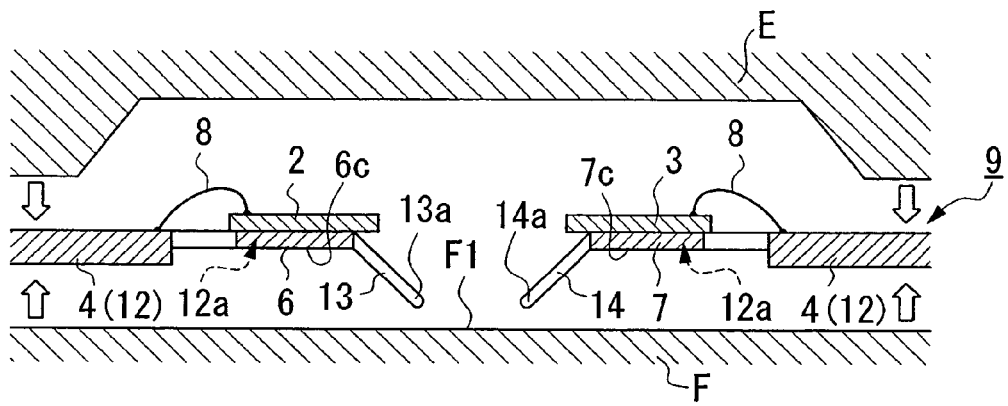
FIG. 7 is a transverse cross-sectional view showing prescribed parts of the magnetic sensor such as stages and magnetic sensor chips, which are held inside of a pair of metal molds.

Next, as shown in FIG. 7, the aforementioned parts associated with the frame 9 except for some parts of the leads 4 and 12 are sandwiched and fixed between a pair of metal molds E and F. The metal molds E and F are merely used for embedding the magnetic sensor chips 2 and 3 inside of a resin.

Figure 8:
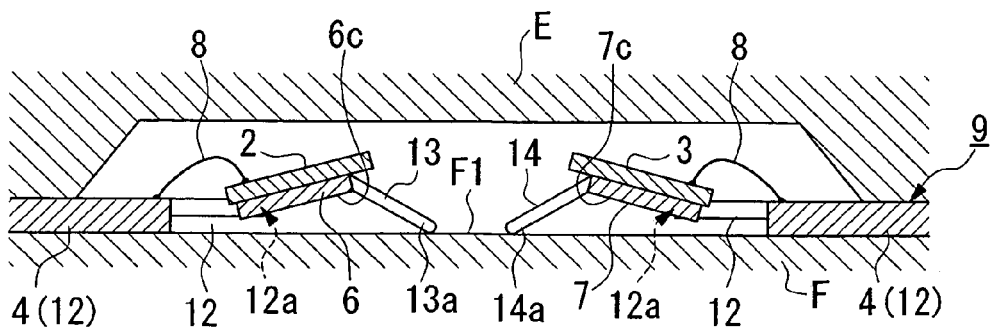
FIG. 8 is a transverse cross-sectional view showing the prescribed parts of the magnetic sensor shown in FIG. 7, in which the stages are respectively inclined at prescribed angles when the metal molds are closed.

In a holding step of the frame 9 being sandwiched between the metal molds E and F, an interior wall F1 of the lower metal mold F presses up the tip ends 13a and 14a of the projections 13 and 14 so that the stage 6 rotates about the axial line lying along the first terminal 6a supported by a pair of the foregoing ends 12a of the leads 12, while the stage 7 rotates about the axial line lying along the first terminal 7a supported by a pair of the foregoing ends 12a of the leads 12, whereby these ends 12a of the leads 12 are each deformed and twisted. Thus, as shown in FIG. 8, the magnetic sensor chips 2 and 3 together with the stages 6 and 7 are respectively inclined to the interior wall F1 of the lower metal mold F by prescribed angles in a magnetic sensor chip inclination step.

In the wire bonding step, the wires 8a, 8b, and 8c are respectively wired from the electrode pads 20a, 20b, and 20c to the leads 40a, 40b, and 40c, wherein as shown in FIG. 3, they have appropriate lengths substantially matching the distances between the electrode pads 20a, 20b, and 20c and the leads 40a, 40b, and 40c.

In the condition where the interior wall F1 of the lower metal mold F presses up the tip ends 13a and 14a of the projections 13 and 14, a melted resin is injected into the space (or a cavity) formed between the metal molds E and F, thus forming a resin mold package for embedding the magnetic sensor chips 2 and 3 inside of the resin. Thus, it is possible to reliably hold the magnetic sensor chips 2 and 3 being mutually inclined in the resin mold package 5.

Lastly, unwanted portions of the rectangular frame portion 11 and the leads 12, which are projected outside of the resin mold package 5, are cut out. Thus, it is possible to complete production of the magnetic sensor shown in FIG. 1.

The magnetic sensor 1 of the present embodiment is characterized in that bonding is performed using the wires 8a, 8b, and 8c having appropriate lengths substantially matching the distances between the electrode pads 20a, 20b, and 20c and the leads 40a, 40b, and 40c, whereby a long distance is covered by long-length bonding, and a short distance is covered by short-length bonding; thus, it is possible to reduce the loads applied to the wires 8.

In the manufacturing method of the magnetic sensor 1, the magnetic sensor chips 2 and 3 are bonded onto the stages 6 and 7 respectively; then, before the inclination of the stages 6 and 7, wire bonding is performed using the wires 8a, 8b, and 8c, which are sequentially increased in length to have appropriate lengths substantially matching the distances between the electrode pads 20a, 20b, and 20c and the leads 40a, 40b, and 40c, whereby it is possible to reduce the loads that are applied to the wires 8 due to the inclination of the magnetic sensor chips 2 and 3.

Both of the step for the inclination of the stages 6 and 7 and the step for the formation of the resin mold package 5 can be performed using the metal molds E and F; hence, it is possible to simplify the overall manufacturing process.

Incidentally, it is possible to appropriately change the shapes and dimensions of the projections 13 and 14 in the lead frame 10, whereby it is possible to easily change the inclined angles of the stages 6 and 7. That is, it is possible to produce various types of magnetic sensors by use of the same set of the metal molds E and F.

The present invention is not necessarily limited to the present embodiment; and the present embodiment can be modified in various manners within the scope of the present invention.

Figure 9:
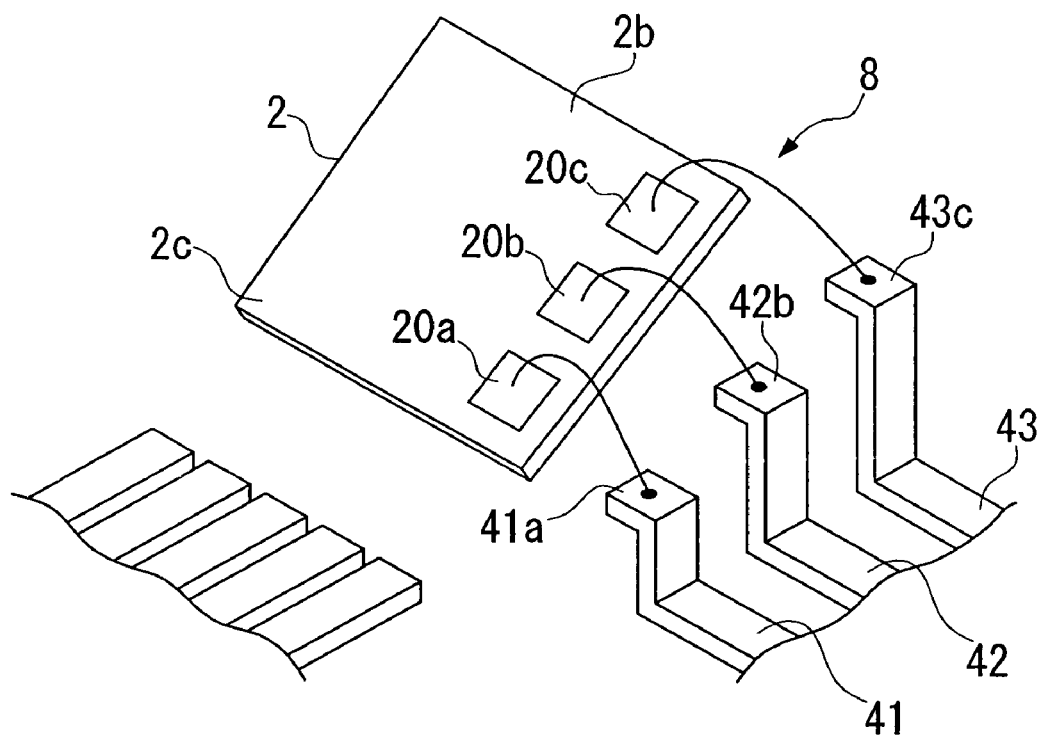
FIG. 9 is an enlarged perspective view showing relationships between electrode pads and modified leads, which are connected together via wires.

For example, as shown in FIG. 9, there are provided different types of leads 41, 42, and 43 having bent shapes, wherein base portions of the leads 41-43 are attached to the lower surface 5a of the resin mold package 5, while tip ends of the leads 41, 42, 43 have surfaces 41a, 42b, and 43c that are respectively elevated to have different heights (measured from the lower surface 5a of the resin mold package 5) substantially matching heights of the electrode pads 20a, 20b, and 20c attached onto the inclined magnetic sensor chip 2 (or the inclined magnetic sensor chip 3). In this modification, the surfaces 41a, 42b, and 43c of the tip ends of the leads 41, 42, and 43 respectively connected to the electrode pads 20a, 20b, and 20c are each controlled in height such that the surface 43c is the highest, and the heights of the other surfaces 42b and 41a are decreased in turn. After wire bonding in which the wires 8 are wired from the electrode pads 20a, 20b, and 20c to the surfaces 41a, 42b, and 43c of the leads 41, 42, ad 43, the magnetic sensor chip 2 is inclined. In this case, the wire ranging from the electrode pad 20c to the surface 43c of the lead 43 is the longest, and the other wires respectively ranging from the electrode pads 20b and 20a to the surfaces 42b and 41a of the leads 42 and 41 are decreased in turn. As wire bonding is performed using the wires 8 that are wired from the electrode pads 20a, 20b, and 20c to the surfaces 41a, 42b, and 43c of the leads 41, 42, and 42 respectively, it is possible to set appropriate lengths for the wires 8; hence, it is possible to efficiently perform wire bonding using the wires 8, and it is possible to reliably prevent the wires from being unexpectedly broken due to the inclination of the magnetic sensor chips 2 and 3.

In the modification shown in FIG. 9, the surfaces 41a, 42b, and 43c of the tip portions of the leads 41, 42, and 43 have different heights (measured from the lower surface 5a of the resin mold package 5) substantially matching the heights of the electrode pads 20a, 20b, and 20c attached onto the surface 2b of the magnetic sensor chip 2. Herein, the heights of the surfaces 41a, 42b, and 43c can be changed to substantially match half the heights of the electrode pads 20a, 20b, and 20c measured from the lower surface 5a of the resin mold package 5. In this case, the lengths of the wires can be further reduced, so that it is possible for a human worker to perform wire bonding with ease.

Next, a manufacturing method of a magnetic sensor having the aforementioned leads 41, 42, and 43 shown in FIG. 9 will be described.

Before a wire bonding step (which has already been described above), it is necessary to provide a lead processing step in which the tip ends of the leads 41, 42, and 43 are respectively changed in heights in conformity with the positions of the electrode pads 20a, 20b, and 20c, which are determined when the magnetic sensor chips 2 and 3 are inclined.

In this manufacturing method, the leads 41, 42, and 43 are processed such that the tip ends thereof are respectively changed in heights in conformity with the positions of the electrode pads 20a, 20b, and 20c, which are determined when the magnetic sensor chips 2 and 3 are inclined, in advance before the stages 6 and 7 are subjected to inclination. Herein, wire bonding is performed using the wires 8, which are wired from the electrode pads 20a, 20b, and 20c, which are mounted on the stage 6 (or the stage 7) horizontally maintained, to the tip ends of the leads 41, 42, and 43 having different heights. This greatly reduces stresses applied to the wires 8 when the magnetic sensor chips 2 and 3 are inclined.

Incidentally, it is preferable to perform the lead processing step before or just before the magnetic sensor chips 2 and 3 are bonded onto the surfaces 6d and 7d of the stages 6 and 7.

The manufacturing method can be modified so as to sequentially perform the lead frame forming step, bonding step, magnetic sensor chip inclining step, and wire bonding step in turn. This modification is advantageous in that wire bonding can be performed using wires having appropriate lengths after the magnetic sensor chips 2 and 3 are inclined.

In addition, it is preferable to insert the lead processing step, in which the tip ends of the leads 41, 42, and 43 are respectively changed in heights in conformity with the positions of the electrode pads 20a, 20b, and 20c attached onto the inclined magnetic sensor chip 2 or 3, between the lead frame forming step and the magnetic sensor chip inclining step. This modification allows the wire boding to be performed using the wires 8 with respect to the tip ends of the leads 41, 42, and 43, which have different heights in conformity with the positions of the electrode pads 20a, 20b, and 20c, after the magnetic sensor chips 2 and 3 are inclined. Herein, as the distances between the electrode pads and leads are reduced so as to reduce the lengths of the wires, it is possible to appropriately control the lengths of the wires and to reliably prevent the wires from being unexpectedly broken.

Figure 10:
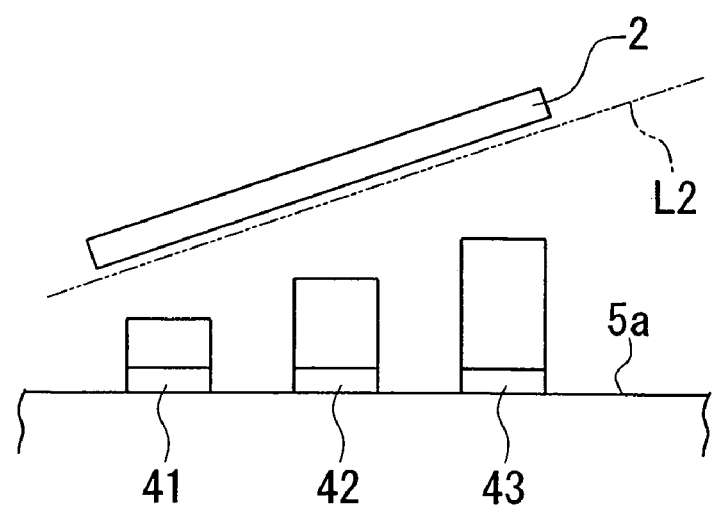
FIG. 10 is a side view diagrammatically showing a modification applied to leads in relation to a magnetic sensor chip.

In FIG. 9, the leads 41, 42, and 43 are respectively modified such that the bonding positions (corresponding to the surfaces of the tip ends 41a, 42b, and 43c of the leads 41, 42, and 43) substantially match the heights of the electrode pads 20a, 20b, and 20c attached on the magnetic sensor chip 2; that is, the surfaces of the tip ends 41a, 42b, and 43c of the leads 41, 42, and 43 are respectively changed in heights so as to realize different bonding positions. However, the present embodiment requires that as shown in FIG. 10, a reference line L2 connecting between the bonding positions of leads 44, 45, and 46 be inclined in an inclination direction of the magnetic sensor chip 2, which is inclined to the lower surface 5a of the resin mold package 5. In the case of FIG. 9, the inclination angle of the reference line L2 matches the inclination angle of the magnetic sensor chip 2 inclined to the lower surface 5a of the resin mold package 5. It is possible to further modify the relationships between the leads 44, 45, and 45 such that as shown in FIG. 11, the reference line L2 is inclined at an inclination angle that differs from the inclination angle of the magnetic sensor chip 2.

Figure 11:
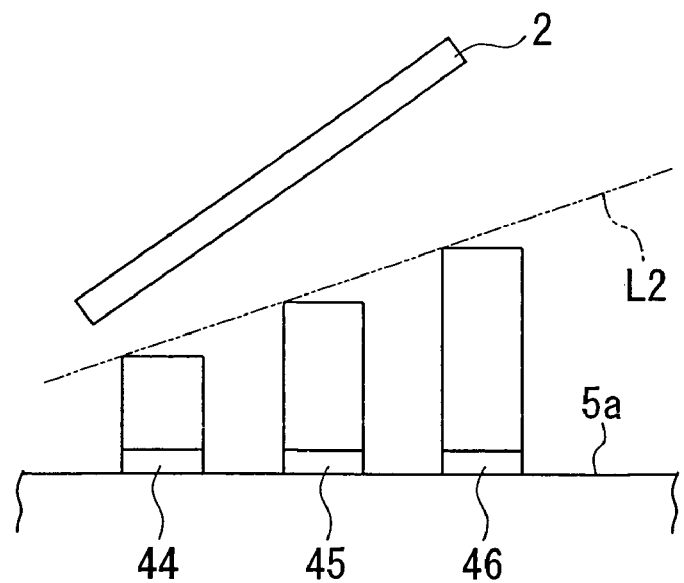
FIG. 11 is a side view diagrammatically showing a further modification applied to leads in relation to a magnetic sensor chip.
Figure 12:
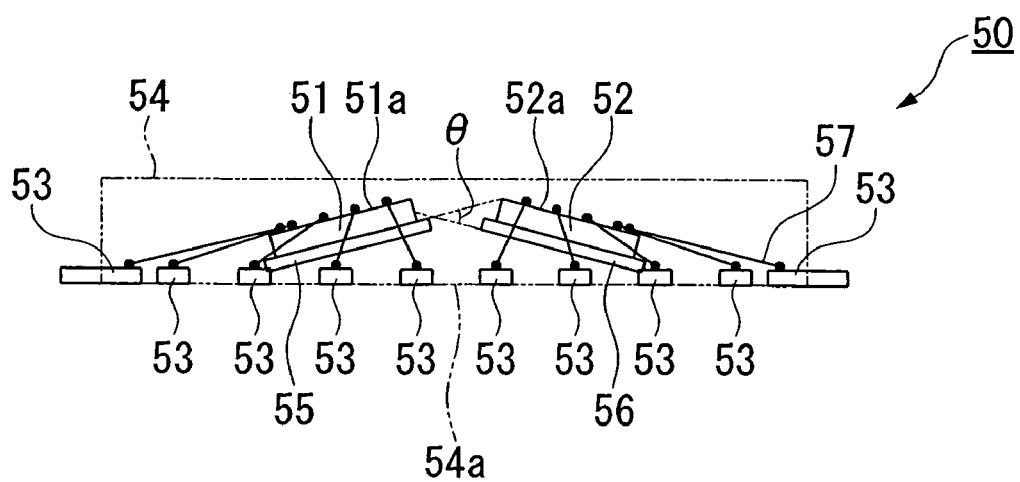
FIG. 12 is a side view partly in cross section showing a structure of a magnetic sensor whose parts are subjected to wire bonding.

In FIGS. 10 and 11, the aforementioned lead processing step is performed to change the heights of the tip ends of the leads 44, 45, and 46, which are forced to substantially match the heights of the electrode pads 20a, 20b, and 20c attached onto the magnetic sensor chip 2. Hence, similar to the aforementioned embodiment, it is possible to reliably prevent the wires from being unexpectedly broken.

By introducing the lead processing step described above, it is possible to appropriately change the heights of the tip ends of the leads 44, 45, and 46 with respect to various types of magnetic sensors whose magnetic sensor chips are inclined at various inclination angles. This may eliminate the necessity of changing values of processing for changing the heights of the tip ends of the leads 44, 45, and 46 in response to various types of magnetic sensors; hence, it is possible to reduce the overall manufacturing cost for producing magnetic sensors.

In the present embodiment, the magnetic sensor chips 2 and 3 are respectively inclined by pressing the tip ends 13a and 14a of the projections 13 and 14 with the interior wall F1 of the lower metal mold F. Instead, it is possible to provide a pre-processed lead frame 10 in which stages 6 and 7 are inclined in advance. In this case, support axes (corresponding to the interconnection portions 12a), by which the magnetic sensor chips 2 and 3 are bonded onto the stages 6 and 7, are firstly subjected to elastic deformation, so that the surfaces of the stages 6 and 7 are forced to be in parallel with the lower surface of the lead frame 10. Thereafter, the magnetic sensor chips 2 and 3 are bonded onto the stages 6 and 7; then, the support axes are subjected to elastic restoration so that the stages 6 and 7 are returned to the originally inclined condition, whereby it is possible to realize the inclination of the magnetic sensor chips 2 and 3 in a stable manner.

In addition, the inclination of the magnetic sensor chips 2 and 3 can be realized by using inclination pins, which project from the metal molds E and F, instead of the projections 13 and 14. That is, when the lead frame 10 is sandwiched between the metal molds E and F, the inclination pins work to incline the stages 6 and 7 inside of the cavity.

In the present embodiment, the ends 12a of the leads 12 are deformed and twisted about the axial lines L1 so as to incline the stages 6 and 7. Instead, prescribed portions of the lead frame 10 corresponding to the axial lines L1 can be reduced in thickness by half etching in advance.

The magnetic sensor chip 2 is sensitive to magnetic factors lying in two directions of an external magnetic field, whereas it is required that the magnetic sensor chip 2 be sensitive to at least a single magnetic factor lying in a single direction of an external magnetic field. The present embodiment uses two magnetic sensor chips 2 and 3; however, the number of magnetic sensor chips is not necessarily limited to two; hence, it is possible to incorporate a single magnetic senor chip or three or more magnetic sensor chips into a magnetic senor.

The present embodiment is basically designed such that the two magnetic sensor chips 2 and 3 are respectively inclined about the two axial lines L1, which are arranged in parallel with each other. The present embodiment can be modified such that the two magnetic sensor chips 2 and 3 are respectively inclined about two support axes, which cross at a right angle with each other. This allows two sensing directions (e.g., directions A and D shown in FIG. 1) realized by the two magnetic sensor chips 2 and 3, which are inclined to be perpendicular to each other, to lie along the lower surface 5a of the resin mold package 5; hence, it is possible to accurately measure magnetism exerted along the lower surface 5a of the resin mold package 5.

It is required that the angle θ between the A-B plane and the C-D plane be greater than 0° and less than 90°; theoretically, it is possible to measure bearing of geomagnetism in a three-dimensional space when the angle θ0 is greater than 0°. Actually, however, it is preferable that the angle θ is greater than 20°; and it is further preferable that the angle θ is greater than 30°.

The present embodiment is adapted to a magnetic sensor that detects the direction of magnetism in a three-dimensional space. Of course, the application of the present embodiment is not necessarily limited to such a magnetic sensor. That is, the present embodiment can offer various types of physical quantity sensors that can detect bearing and direction in a three-dimensional space. In addition, the present embodiment can offer various acceleration sensors that incorporate acceleration sensor chips for detecting the magnitude and direction of acceleration instead of magnetic sensor chips.

2. Second Embodiment

Next, a physical quantity sensor (i.e., a magnetic sensor) of a second embodiment of the present invention will be described with reference to FIGS. 13 to 22. Similar to in the first embodiment, the magnetic sensor of the second embodiment is designed to measure the magnitude of an external magnetic field by use of two magnetic sensor chips that are inclined at prescribed angles, wherein it is produced using a lead frame that is formed by performing press working and etching on a thin metal plate composed of copper and the like.

Figure 13:
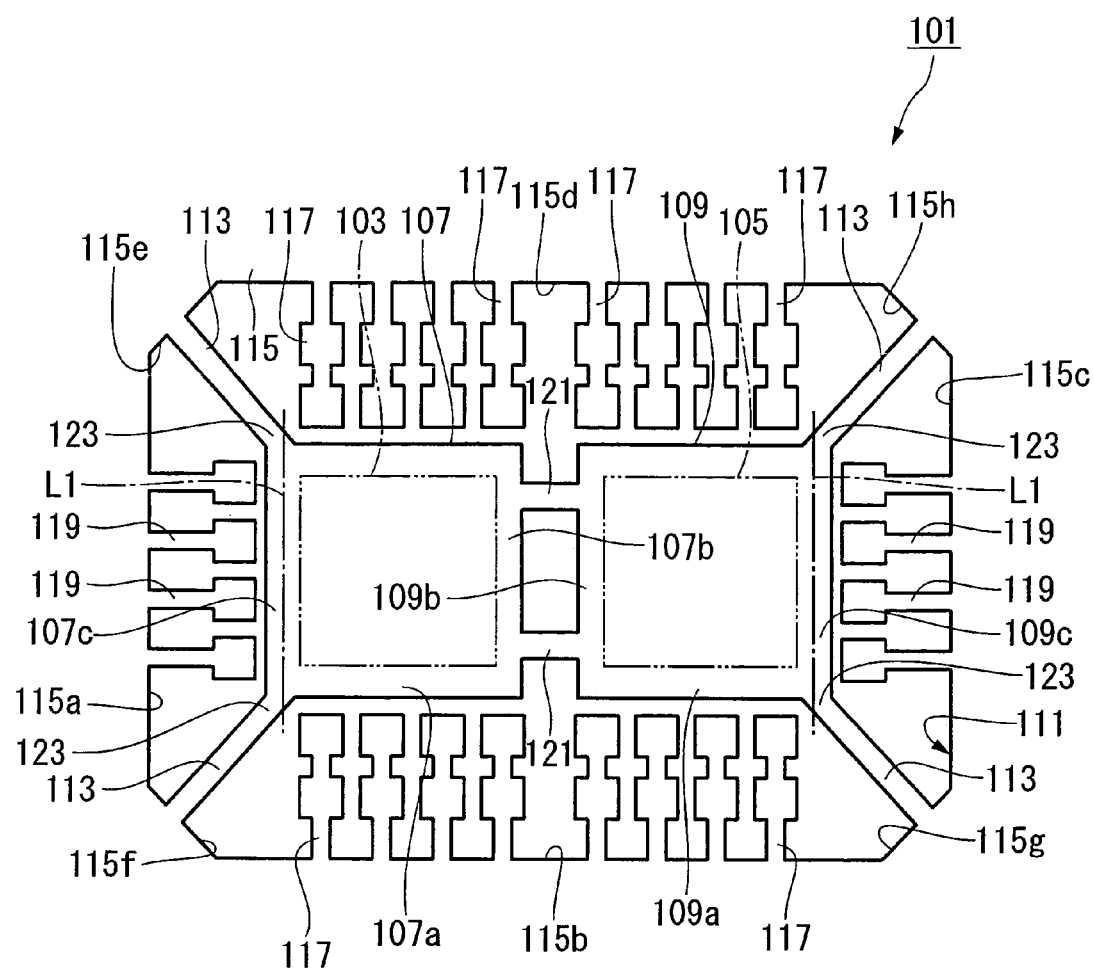
FIG. 13 is a plan view showing the structure of a lead frame for use in the manufacturing of a magnetic sensor in accordance with a second embodiment of the present invention.

FIG. 13 shows the structure of a lead frame 101 that is constituted by two stages 107 and 109 (each having a rectangular shape in a plan view) for respectively mounting magnetic sensor chips (or physical quantity sensor chips) 103 and 105 thereon, a frame 111 for supporting the stages 107 and 109, and leads (or interconnection portions) 113 for interconnecting together the stages 107 and 109 and the frame 111, wherein the stages 107 and 109, the frame 111, and the interconnection portions 113 are integrally formed together.

The frame 111 is constituted by a rectangular frame portion 115 for encompassing the stages 107 and 109, and a plurality of leads 117 and 119 that inwardly project from four sides 115a to 115d of the rectangular frame portion 115. Herein, a prescribed number of the leads 117 and 119 are arranged for each of the four sides 115a to 115d of the rectangular frame portion 115 for the purpose of establishing electric connection with bonding pads (not shown) of the magnetic sensor chips 103 and 105.

In the above, the leads 117 projecting from the two sides 115b and 115d of the rectangular frame portion 115, which lie in parallel along a stage arrangement direction for arranging the two stages 107 and 109 are elongated longer compared with other leads 119 projecting from the other two sides 115a and 115c of the rectangular frame portion 115, which lie perpendicular to the stage arrangement direction.

The stages 107 and 109 have surfaces 107a and 109a, each having a rectangular shape in a plan view, for respectively mounting the magnetic sensor chips 103 and 105 thereon, wherein they are arranged in the stage arrangement direction.

In addition, the stages 107 and 109 respectively have terminals 107b and 109b, which are arranged opposite to each other, wherein two stage interconnection portions 121 are formed to interconnect together the stages 107 and 109 at the terminals 107b and 109b. The stage interconnection portions 121 are formed for the purpose of the prevention of unwanted movement of the stages 107 and 109, wherein they are easily deformed.

Four interconnection leads 113 project inwardly from four corners 115e, 115f, 115g, and 115h of the rectangular frame portion 115 towards other terminals 107c and 109c of the stages 107 and 109, wherein two interconnection leads 113 respectively projecting from the two corners 115e and 115f are interconnected to both ends of the terminal 107c of the stage 107, and two interconnection leads 113 respectively projecting from the two corners 115g and 115h are interconnected to both ends of the terminal 109c of the stage 109. Herein, the two ends of the terminal 107c define the width of the stage 107, and the two ends of the terminal 109c define the width of the stage 109.

Four easy-to-deform portions 223 are respectively formed at tip ends of the interconnection leads 113 in proximity to both ends of the terminal 107c and both ends of the terminal 109c respectively. Herein, two reference lines L1 are respectively drawn perpendicular to the thickness direction of the rectangular frame portion 115 along the terminals 107c and 109c respectively. The easy-to-deform portions 223 are formed easy to be deformed in order to change the directions of the stages 107 and 109 along the reference lines L1. Incidentally, the reference lines L1 are drawn perpendicular to the stage arrangement direction for the stages 107 and 109.

Figure 14:
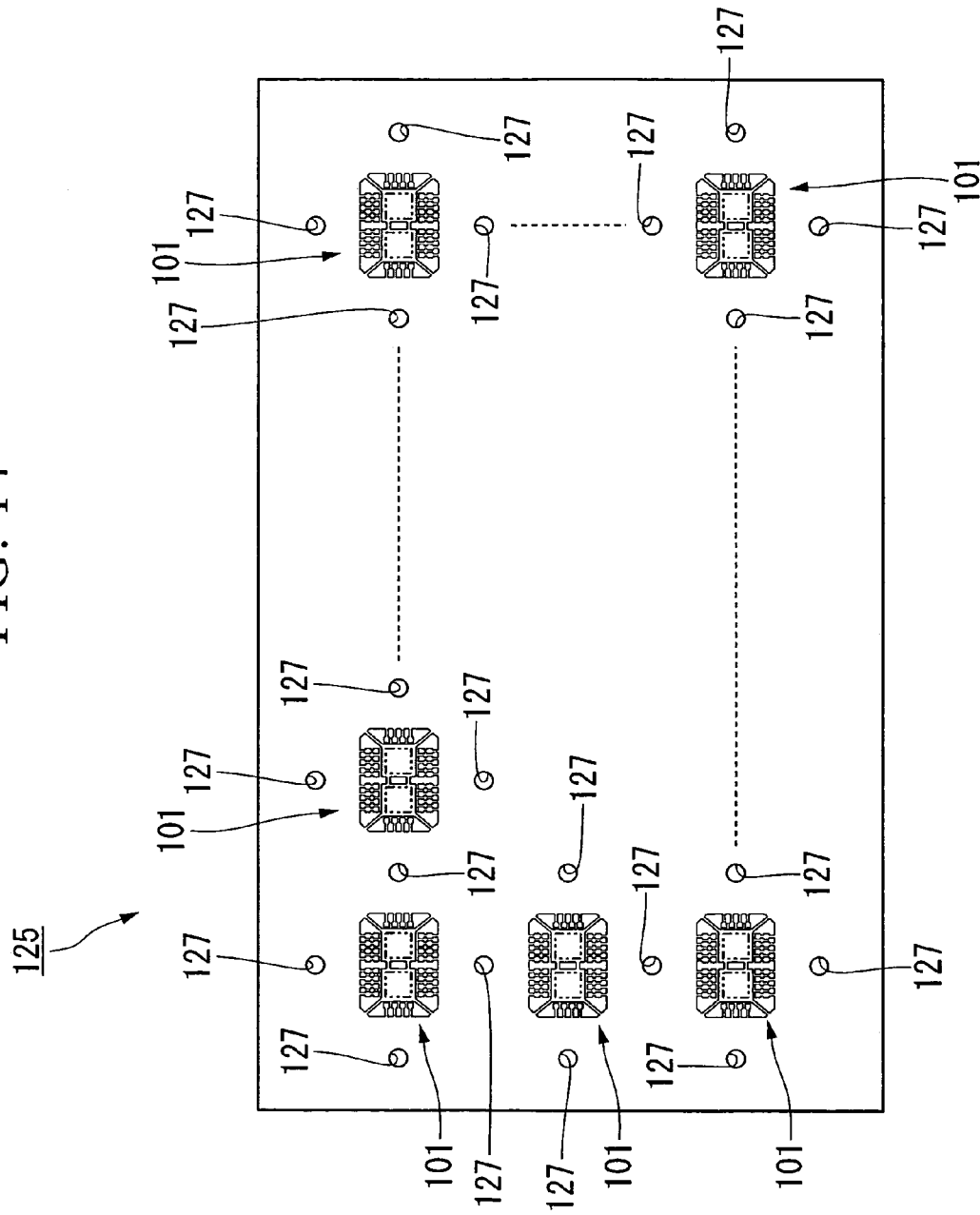
FIG. 14 is a plan view showing a thin metal plate in which a plurality of lead frames each corresponding to the lead frame shown in FIG. 13 are formed.

As shown in FIG. 14, a plurality of lead frames (each corresponding to the lead frame 1) are simultaneously formed by performing press working and etching on a thin metal plate 125 composed of copper. According to the present embodiment, a plurality of lead frames are produced from a single sheet of the thin metal plate 125, wherein the number of lead frames and positions of lead frames can be appropriately changed as necessary. A plurality of through holes 127 are formed at prescribed positions running through the thin metal plate 125 in the periphery of each lead frame 1.

Next, a manufacturing method of a magnetic sensor using the lead frame 1 will be described in detail.

Figure 15:
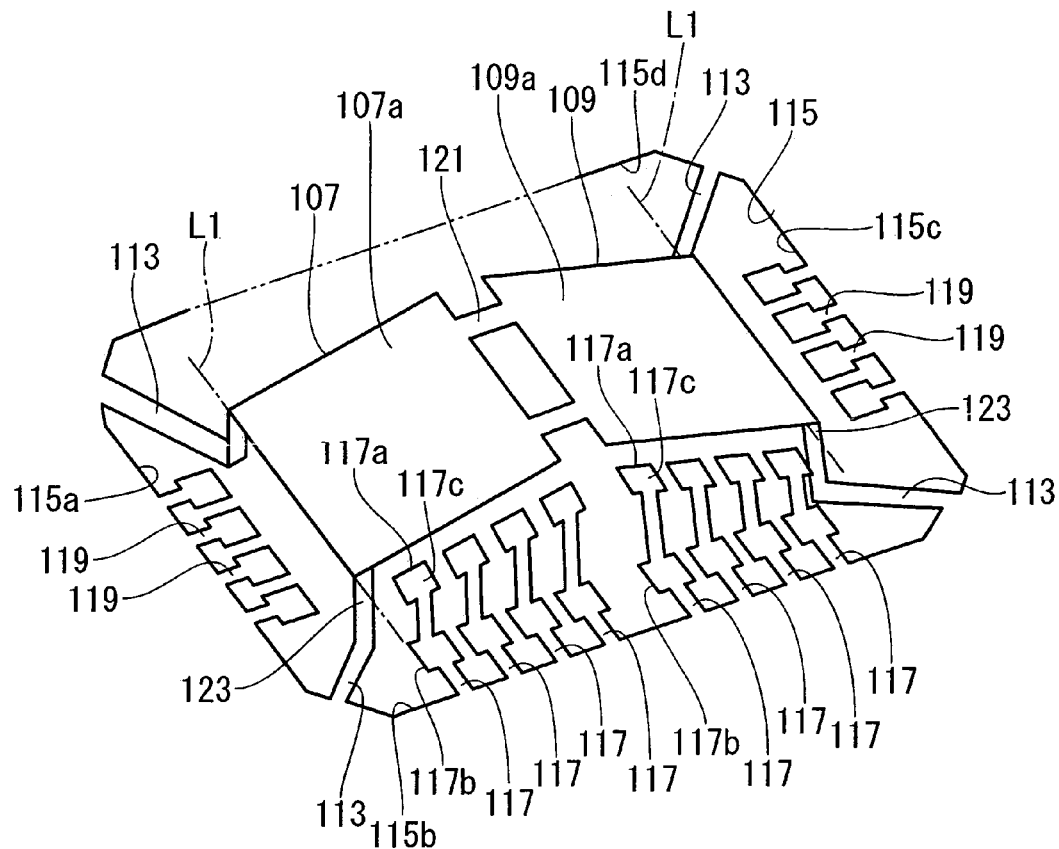
FIG. 15 is a perspective view showing the lead frame that is subjected to a stage inclining step and a lead processing step.
Figure 16:
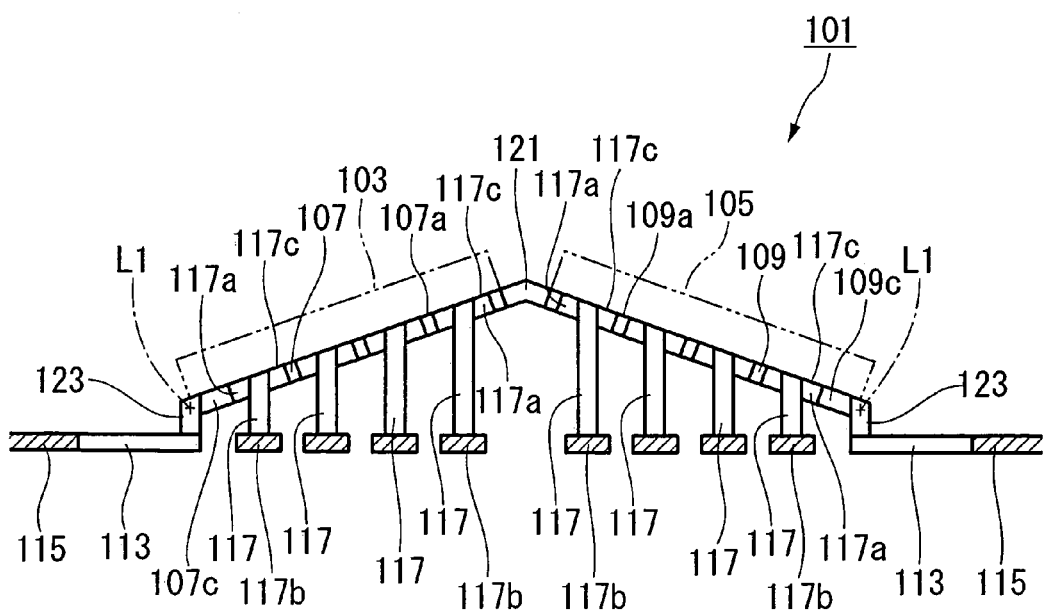
FIG. 16 is a side view partly in cross section showing the lead frame shown in FIG. 15.
Figure 17A:
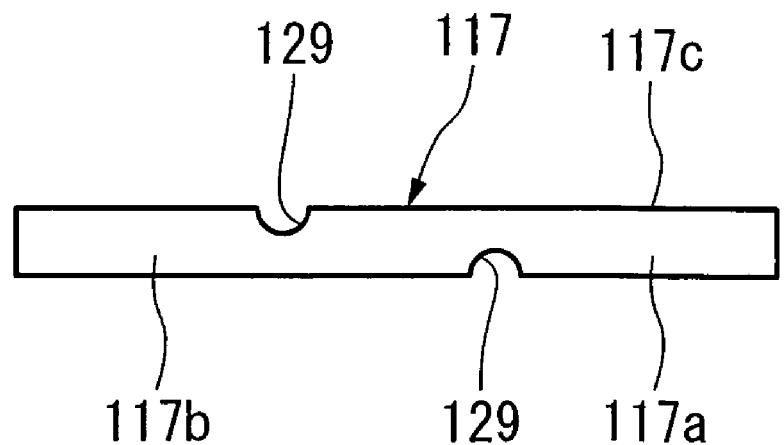
FIG. 17A is a side view showing a lead that is partially modified to have recesses.
Figure 17B:
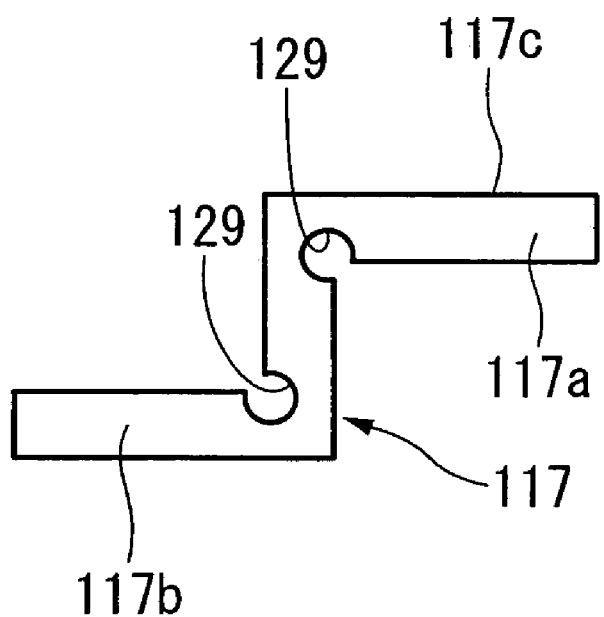
FIG. 17B is a side view showing the lead of FIG. 17A after completion of a lead processing step.

First, there is provided a lead frame 1 having the aforementioned structure in a preparation step. The lead frame 1 is subjected to press working so that as shown in FIGS. 15 and 16, stages 107 and 109 are respectively changed in direction and are thus inclined with respect to a rectangular frame portion 115 about reference lines L1 in a stage inclination step. Simultaneously, tip ends 117a of leads 117, which are selected and positioned in proximity to the stages 107 and 109 within all leads 117 arranged in a stage arrangement direction for arranging the stages 107 and 109, are respectively arranged in inclination directions of the stages 107 and 109 in a lead processing step. For the sake of convenience, FIG. 15 does not illustrate leads 117 that are disposed along a prescribed side 115d of the rectangular frame portion 115 in relation to the stages 107 and 109; actually however, leads 117 are also disposed along the side 115d similarly to leads 117 disposed along the other side 115b.

In the stage inclination step, easy-to-deform portions 123 of interconnection leads 113 and stage interconnection portions 121 are appropriately deformed due to press working; hence, the stages 107 and 109 are respectively changed in direction about the reference lines L1. In addition, terminals 107c and 109c of the stages 107 and 109 are respectively shifted in position, compared with the rectangular frame portion 115, in the thickness direction of the thin metal plate 125.

In the lead processing step, intermediate portions of the leads 117 are appropriately bent due to press working so that the tip ends 117a can be disposed in prescribed directions.

In order for the leads 117 to be easily bent in press working, it is preferable to appropriately shape leads 117 as shown in FIGS. 15A and 15B, wherein recesses 129 are formed on front and back sides of the intermediate portions of the leads 117 by way of photo-etching. Alternatively, recesses 129 are formed on front and back sides of easy-to-deform portions 123 of interconnection leads 113 by way of photo-etching, for example. Photo-etching can be performed in a lead frame forming step in which the thin metal plate 125 is shaped into the lead frame 101, for example.

As shown in FIGS. 15A and 15B, the recesses 129 reduce dimensions regarding thickness in the intermediate portions of the lead 117, which are subjected to bending, in comparison with other portions of the leads 117. This precisely sets the heights of the tip ends 117*a* of the leads 117 relative to the rectangular frame portion 115.

FIGS. 15 and 16 shows the overall structure of the lead frame 1 subjected to press working, wherein the tip ends 117*a* of the leads 117 are respectively shifted in position in the thickness direction of the rectangular frame portion 115 in comparison with base portions 117*b* of the leads 117, and surfaces 117*c* of the tip ends 117*a* of the leads 117 are respectively arranged in elevation in conformity with the surfaces 107*a* and 109*a* of the stages 107 and 109 that are respectively inclined at prescribed angles with respect to the rectangular frame portion 115.

Figure 18:
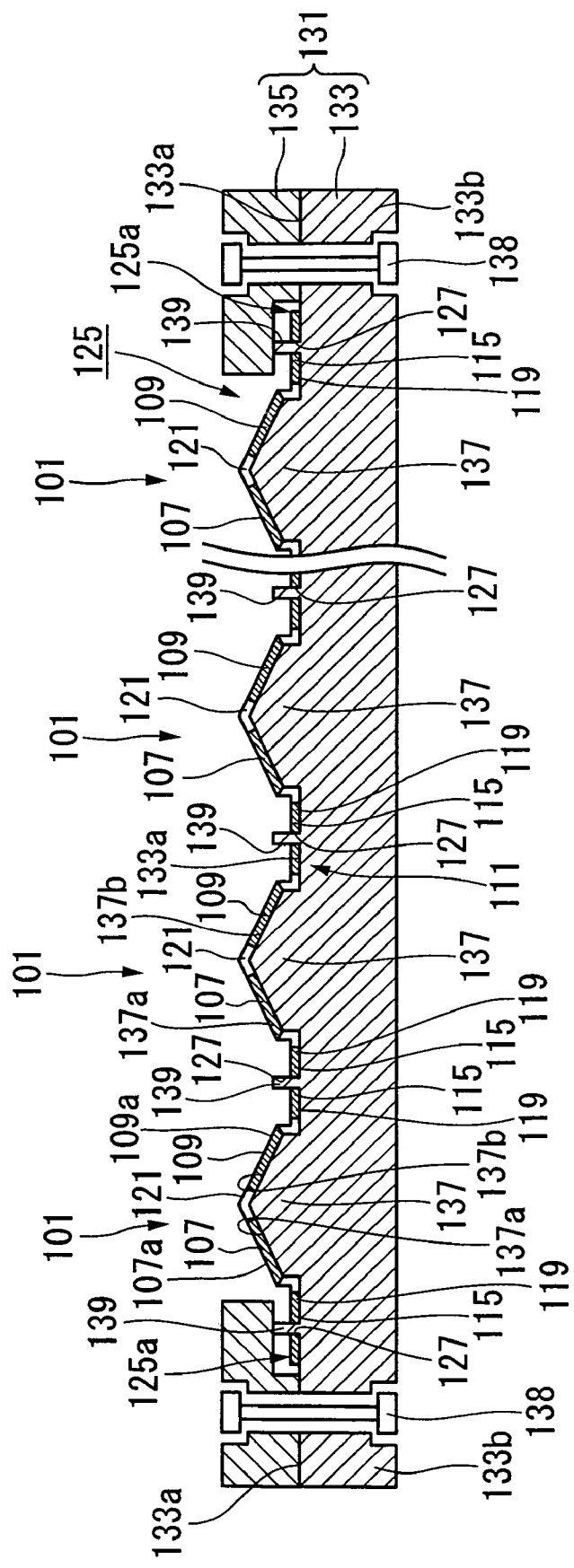
FIG. 18 is a cross-sectional view showing the thin metal plate having a plurality of lead frames, which is fixed to a support unit.

After the completion of the stage inclination step and the lead processing step, the thin metal plate 125 having plural lead frames 101 is fixed to a support unit 131 as shown in FIG. 18. The support unit 131 includes a first instrument 133, in which the thin metal plate 125 having plural lead frames 101 is attached onto a surface 133*a*, and a second instrument 135 for holding the thin metal plate 125 together with the first instrument 133.

On the surface 133*a* of the first instrument 133, there are formed a plurality of stage support portions 137, the number of which corresponds to the number of the lead frames 101 formed on the thin metal plate 125, and a plurality of projections 139 that project and are respectively inserted into the through holes 127 of the thin metal plate 125.

Each of the stage support portions 137 has a wedge shape having slopes 137*a* and 137*b*, on which the stages 107 and 109 are respectively arranged. FIG. 18 does not precisely illustrate the relationships between the stages 107 and 109 and the stage support portion 137, wherein the tip ends 117*a* of the leads 117, which are disposed along the surfaces 107*a* and 109*a* of the stages 107 and 109, are also arranged on the slopes 137*a* and 137*b* of the stage support potion 137.

By establishing the condition in which the stages 107 and 109 and the leads 117 are respectively arranged on the stage support portion 137, it is possible to appropriately maintain the stages 107 and 109 and the tip ends 117*a* of the leads 117 in terms of positions and inclinations.

In the condition in which the rectangular frame portions 115 are arranged on the surface 133*a* of the first instrument 133, the projections 139 are respectively inserted into the through holes 127 of the thin metal plate 125; hence, it is possible to prevent the lead frames 101 from being shifted from the stage support portions 137 in position. That is, the first instrument plays a function for collectively supporting the stages 107 and 109 and the lead frames 101.

The second instrument 135 is arranged on a surface 133*a* of a peripheral portion 133*b* of the first instrument 133, wherein it is positioned to match tip ends of the projections 139, which are inserted into the through holes 127 formed in a peripheral portion 125*a* of the thin metal plate 125, so that it prevents the thin metal plate 125 from being unexpectedly disengaged from the projections 139. The first instrument 133 and the second instrument 135 are used to hold the thin metal plate 125 therebetween, wherein they are mutually fixed to each other by use of fixing members 138 such as bolts.

Figure 19:
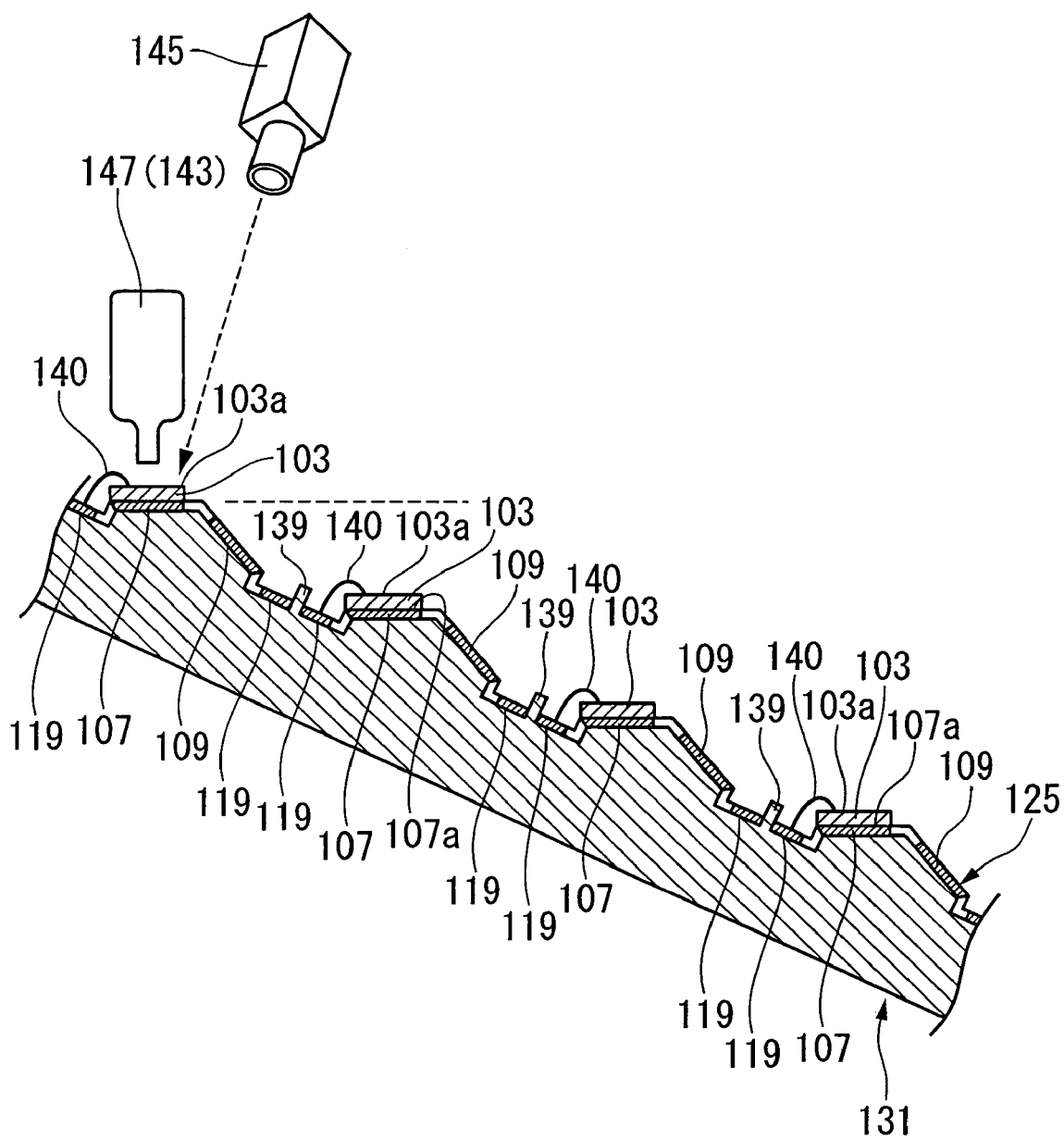
FIG. 19 is a cross-sectional view showing a part of the thin metal plate that is inclined so as to perform a bonding step and a wiring step on prescribed stages included in the lead frames.
Figure 20:
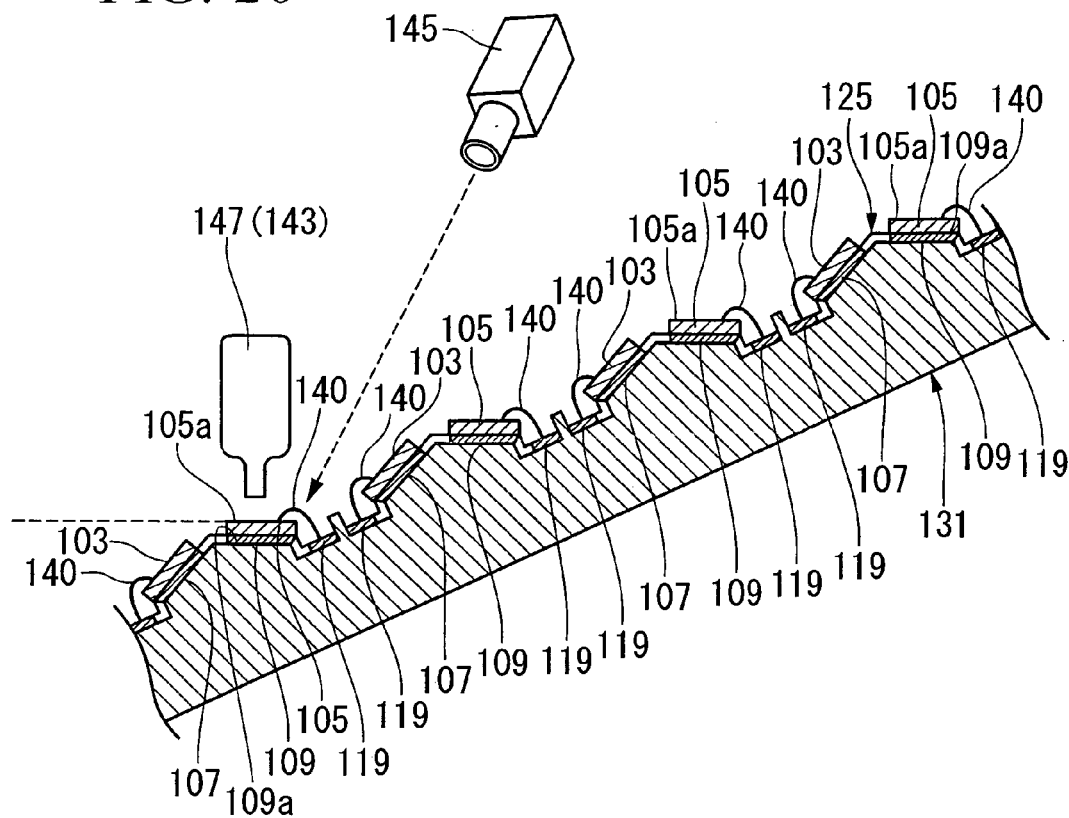
FIG. 20 is a cross-sectional view showing another part of the thin metal plate that is inclined so as to perform a bonding step and a wiring step on other stages included in the lead frames.
Figure 21:
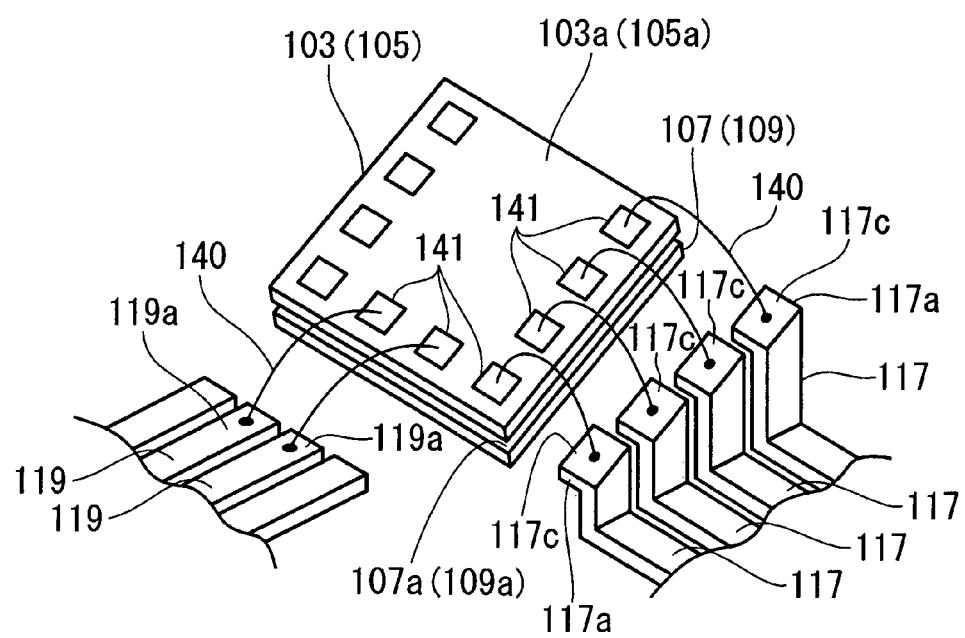
FIG. 21 is an enlarged perspective view showing relationships between bonding pads and leads, which are connected together via wires.

As shown in FIGS. 19 to 21, the magnetic sensor chips 103 and 105 are respectively bonded onto the surfaces 107*a* and 109*a* of the stages 107 and 109 by use of silver paste in a bonding step. In addition, wire bonding is performed so as to electrically connect bonding pads 141, which are formed on the surfaces 103*a* and 105*a* of the magnetic sensor chips 103 and 105, to the leads 117 and 119 via wires 140 in a wiring step. The aforementioned bonding step and wiring step are performed by causing inclination (or swing movement) on the thin metal plate 125, which is fixed to the support unit 131, such that the surface 107*a* of the stage 107 or the surface 109*a* of the stage 109 is held horizontally.

In the bonding step, a collet 143 is used to supply silver paste onto the surfaces 107*a* and 109*a* of the stages 107 and 109. The collet 143 is arranged to supply silver paste downwardly in a vertical direction. That is, in the bonding step, the collet 143 is directed to be substantially perpendicular to the surfaces 107*a* and 109*a* of the stages 107 and 109. Incidentally, the bonding step is performed based on image data, which are produced by a positioning camera 145, so as to adjust the positional relationship between the magnetic sensor chips 103 and 105 and the stages 107 and 109.

In the wiring step, a capillary 147 is used to supply materials of wires 140 downwardly in a vertical direction. That is, in the wiring step, the capillary 147 is directed to be substantially perpendicular to the surfaces 107*a* and 109*a* of the stages 107 and 109. In the wiring bonding, the capillary 147 moves between the tip ends 117*a* and 119*a* of the leads 117 and 119 and the bonding pads 141 of the magnetic sensor chips 103 and 105, whereby the magnetic sensor chips 103 and 105 are electrically connected to the leads 117 via the wires 140. The wires 140 each have fixed lengths irrespective of the heights (or vertical positions) of the bonding pads 141.

Positional adjustment between the capillary 147, the tip ends 117*a* of the leads 117, and the bonding pads 141 is performed using a prescribed device, which may be similar to the positioning camera 145 used in the bonding step. Incidentally, the positioning camera 145 is installed in the same equipment including the collet 143 and the capillary 147 that is used in the bonding step and wiring step.

The aforementioned bonding step and wiring step are performed separately for each of the surfaces 107*a* and 109*a* of the stages 107 and 109. Firstly, the bonding step and wiring step are performed on the surfaces 107*a* of the stages 107, which are held horizontally as shown in FIG. 19. Thereafter, the thin metal plate 125 is inclined (or moved) so that the bonding step and wiring step are performed on the surfaces 109*a* of the stages 109, which are held horizontally as shown in FIG. 20.

The aforementioned bonding step and wiring step may cause heat and mechanical stress due to bonding or wire bonding for the magnetic sensor chips 103 and 105. For this reason, it is preferable that the first instrument 133 of the support unit 131 be composed of a prescribed metal having a sufficient resistance to heat and mechanical stress.

Figure 22:
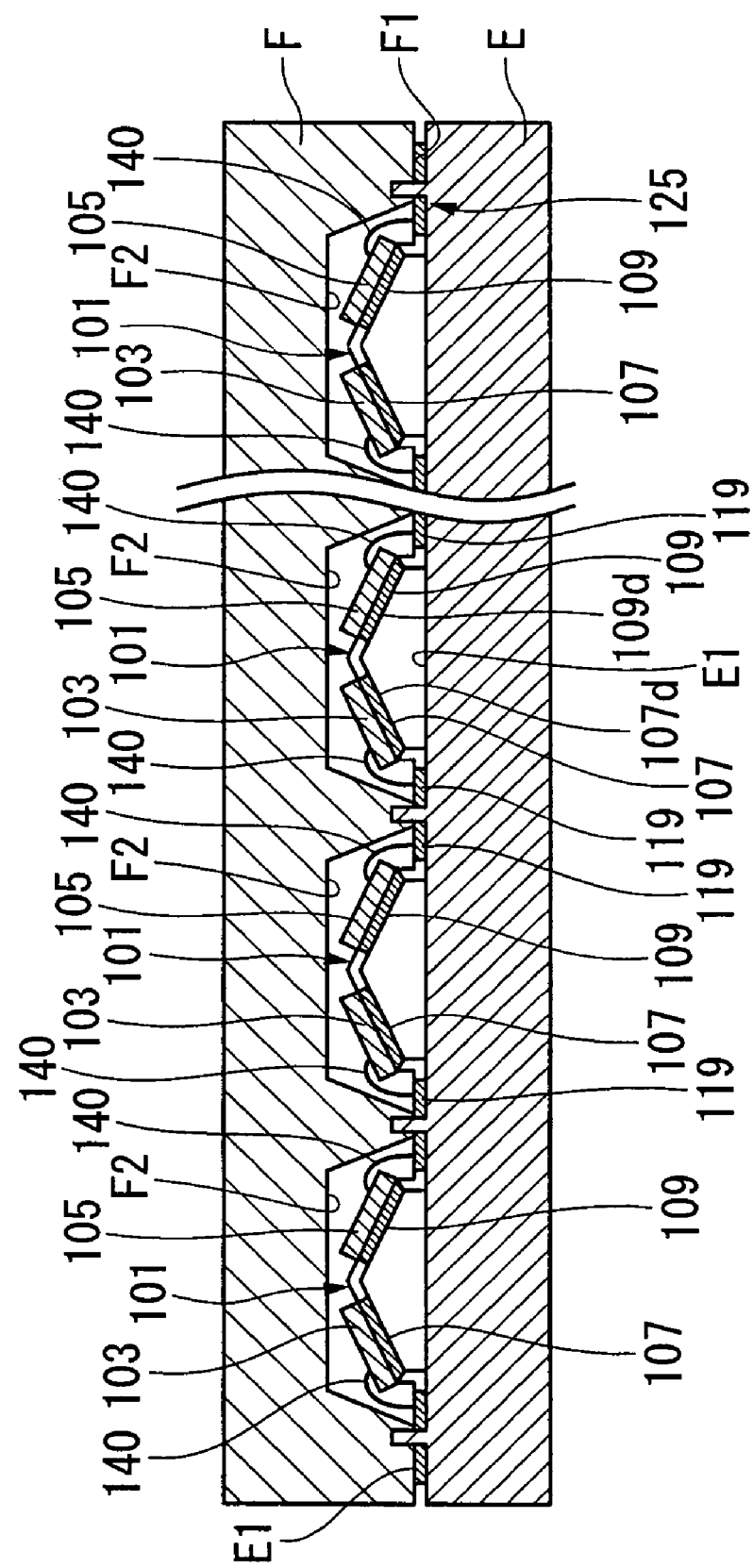
FIG. 22 is a cross-sectional view diagrammatically showing an arrangement of lead frames having stages, which are sandwiched between metal molds.

After the completion of the bonding step and wiring step, the thin metal plate 125 is extracted from the support unit 131; then, as shown in FIG. 22, the thin metal plate 125 is sandwiched between a pair of metal molds E and F in a vertical direction. The lower metal mold E has a planar surface E1 on which the rectangular frame portions 115 and the leads 119 are arranged. The upper metal mold F has a plurality of recesses F2, each of which recedes from a surface F1. Thus, in the condition in which the rectangular frame portions 115 of the thin metal plate 125 are sandwiched between the metal molds E and F, the magnetic sensor chips 103 and 105, the stages 107 and 109 of the lead frames 101, and the leads 117 and 119 are respectively held inside of the recesses F2.

Thereafter, a melted resin is injected into a resin forming space (or a cavity), which is defined by the recess F2 of the upper metal mold F and the planar surface E1 of the lower metal mold E, wherein a resin mold package for embedding the magnetic sensor chips 103 and 105 therein is to be formed in a molding step.

In the molding step, the stages 107 and 109 are collectively shifted in position in the thickness direction of the thin metal plate 125 relative to the rectangular frame portion 115; hence, it is possible to easily make the melted resin flow towards the backsides 107d and 109d of the stages 107 and 109. As a result, it is possible to easily fill the gaps between the backsides 107d and 109d of the stages 107 and 109 and the planar surface E1 of the lower metal mold E with the melted resin.

Figure 23:
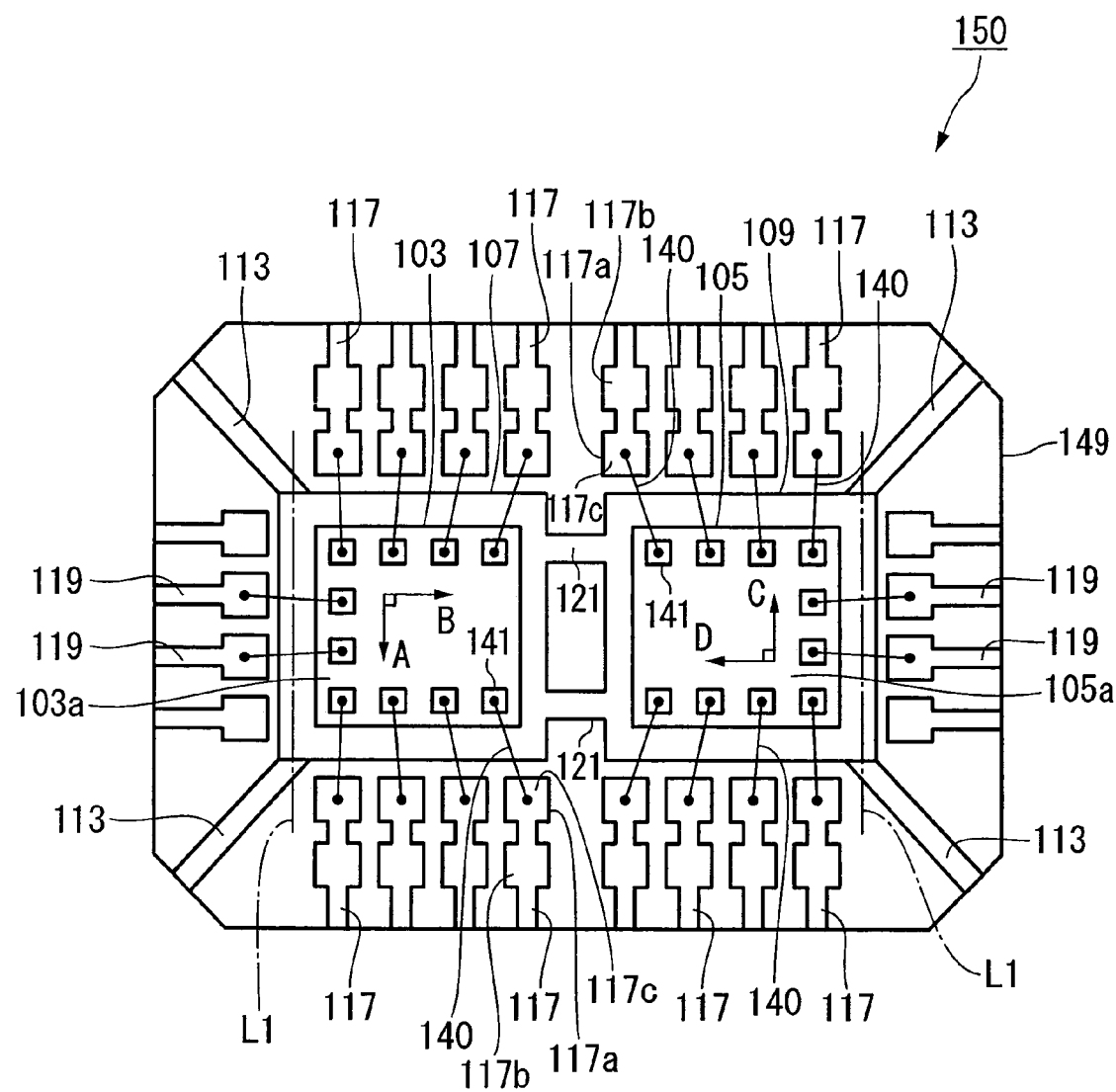
FIG. 23 is a plan view showing the overall structure of a magnetic sensor that is manufactured using the lead frame shown in FIG. 13.
Figure 24:
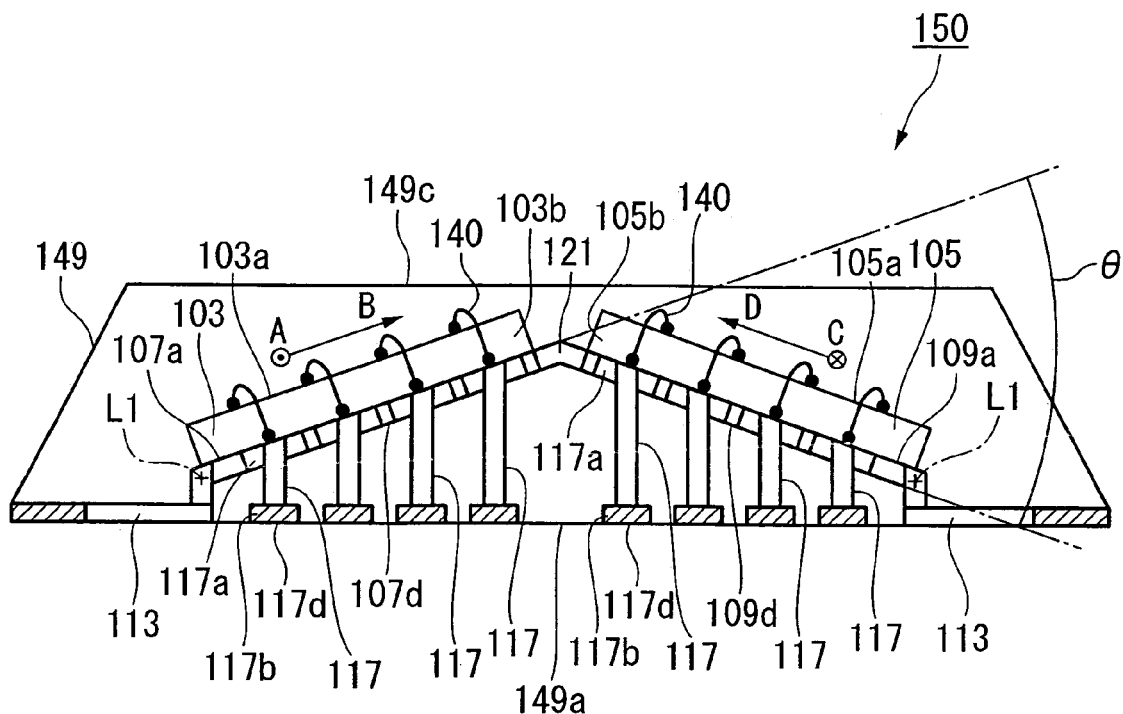
FIG. 24 is a cross-sectional view showing the internal structure of the magnetic sensor that is manufactured using the lead frame shown in FIG. 13.

The aforementioned molding step assures that as shown in FIGS. 23 and 24, the magnetic sensor chips 103 and 105 are fixed inside of a resin mold package 149 while they are inclined with respect to each other with a prescribed angle therebetween. Herein, it is preferable to use a high fluidity material for a resin in order that inclination angles set with respect to the magnetic sensor chips 103 and 105 be not changed due to the flow of the resin.

Lastly, the rectangular frame portion 115 is cut out so as to individual isolate the interconnection leads 113 and the leads 117 and 119; thus, it is possible to complete the manufacturing of a magnetic sensor 150.

In the magnetic sensor 150 that is manufactured as described above, the resin mold package 149 has a rectangular shape in a plan view similarly to the aforementioned rectangular frame portion 115. Herein, the backsides of the leads 119 and the backsides 117d of the base portions 117b of the leads 117 are exposed onto a lower surface 149a of the resin mold package 149. In addition, the tip ends 117a of the leads 117 are electrically connected to the magnetic sensor chips 103 and 105 via the metal wires 140, wherein connected portions therebetween are embedded inside of the resin mold package 149.

The magnetic sensor chips 103 and 105 are embedded inside of the resin mold package 149, wherein they are respectively inclined with respect to the lower surface 149a of the resin mold package 149. As to the magnetic sensor chips 103 and 105, the terminals 103b and 105b, which are arranged opposite to each other, are directed upwardly towards an upper surface 149c of the resin mold package 140. In addition, the surfaces 103a and 105a of the magnetic sensor chips 103 and 105 are mutually inclined with respect to each other with an acute angle therebetween. Herein, the acute angle corresponds to an angle θ formed between the surface 107a of the stage 107 and the surface 109a of the stage 109 as shown in FIG. 24.

The magnetic sensor chip 103 is sensitive to two magnetic factors lying in two directions of an external magnetic field, thus realizing two sensing directions (i.e., directions A and B), which are perpendicular to each other along the surface 103a of the magnetic sensor chip 103.

The magnetic sensor chip 105 is sensitive to two magnetic factors lying in two directions of an external magnetic field, thus realizing two sensing directions (i.e., directions C and D), which are perpendicular to each other along the surface 105a of the magnetic sensor chip 105.

In the above, the directions A and B lie in parallel with the reference lines L1 drawn with respect to the stages 107 and 109, wherein they are directed opposite to each other. In contrast, the directions B and D lie perpendicular to the reference lines L1, wherein they are directed opposite to each other.

In addition, the acute angle θ is formed between the A-B plane, which is defined by the directions A and B along the surface 103a of the magnetic sensor chip 103, and the C-D plane, which is defined by the directions C and D along the surface 105a of the magnetic sensor chip 105.

In the above, the angle θ formed between the A-B plane and the C-D plane is greater than 0° but is smaller than 90°; theoretically, it is possible to measure bearing of geomagnetism in a three-dimensional manner as long as the angle θ is greater than 0°. However, it is preferable that the angle θ be greater than 20° in order to sense geomagnetism vectors lying in the vertical direction to the A-B plane or C-D plane with a least minimum sensitivity and to calculate geomagnetism vectors with small error. In order to further reduce calculation error, it is preferable that the angle θ be greater than 30°.

The aforementioned magnetic sensor 150 is installed in a portable terminal device (not shown) in which it is attached onto a board and the like. This portable terminal device is designed to display bearing of geomagnetism, which is measured by the magnetic sensor 150, on a display panel.

According to the manufacturing method of the lead frame 101 and the magnetic sensor 150 described above, before the bonding step and wiring step, the stages 107 and 109 are subjected to inclination in advance, and the leads 117 are disposed in the inclination directions of the stages 107 and 109. This assures the stages 107 and 109 not to unexpectedly move relative to the frame 111 in the condition in which the magnetic sensor chips 103 and 105 are respectively bonded onto the stages 107 and 109 and in the condition in which the magnetic sensor chips 103 and 105 are electrically connected to the leads 117 via the wires 140. Therefore, in the manufacturing of the magnetic sensor chip 150, it is possible to reliably prevent unwanted stress from being applied to the magnetic sensor chips 103 and 105 as well as the wires 140; that is, it is possible to easily avoid the occurrence of electric connection failure between the magnetic sensor chips 103 and 105 and the leads 117.

In addition, the tip ends of the leads 117 are disposed in parallel with the bonding wires 141 of the magnetic sensor chips 103 and 105, which are mounted on the surfaces 107a and 109a of the stages 107 and 109. This eliminates the necessity of changing the lengths of the wires 140 in connection with the leads 117 respectively in the wire bonding. Hence, it is possible to easily perform the wire bonding for connecting the tip ends of the leads 117 to the bonding pads 140.

Both of the stage inclining step and the lead processing step can be simultaneously performed by press working; hence, it is possible to arrange the tip ends 117a of the leads 117 at prescribed heights substantially matching heights of the bonding pads 141 of the magnetic sensor chips 103 and 105 with ease and within a short period of time. This improves the manufacturing efficiency regarding the magnetic sensor 150 and reduces the manufacturing cost therefor.

As the tip ends 117a of the leads 117 are disposed in the inclination directions of the stages 107 and 109, it is possible to minimize the distances between the leads 117 and the surfaces 103a and 105a of the magnetic sensor chips 103 and 105, which are bonded onto the stages 107 and 109. That is, in the wiring step, it is possible to reduce the lengths of the wires 140 used for electrically connecting the leads 117 to the magnetic sensor chips 103 and 105; hence, it is possible to further reduce the manufacturing cost regarding the magnetic sensor 150.

In the present embodiment, the thin metal plate 125 is fixed to the support unit 131, and in particular, all of the stages 107 and 109, the tip ends 117a of the leads 117, and the frame 111 are collectively supported by the first instrument 133. In the bonding step and wiring step, it is possible to prevent the stages 107 and 109 and the leads 117 from being unexpectedly deformed; hence, it is possible to perform bonding of the magnetic sensor chips 103 and 105 onto the stages 107 and 109 in a stable manner, and it is possible to electrically connect the leads 117 and 119 to the magnetic sensor chips 103 and 105 in a stable manner. This makes it possible to reliably avoid the occurrence of electric connection failure between the magnetic sensor chips 103 and 105 and the leads 117. In addition, it is possible to maintain the magnetic sensor chips 103 and 105 at prescribed inclination angles; thus, it is possible to provide a high-precision magnetic sensor chip 150.

Furthermore, in the bonding step and wiring step, the thin metal plate 125 is appropriately inclined (or moved) in response to the inclination angles of the stages 107 and 109 respectively, wherein the collet 143 and the capillary 147 are directed perpendicular to the surfaces 107a and 109a of the stages 107 and 109 as well as the surfaces 103a and 105a of the magnetic sensor chips 103 and 105 respectively. This makes it possible to perform setup and adjustment on prescribed devices, which are required in the bonding step and wiring step; in particular, it is possible to arrange and set up the collet 143 and the capillary 147 with ease. For example, it is possible to focus the positioning camera 145 on the surfaces 107a and 109a of the stages 107 and 109 as well as the surfaces 103a and 105a of the magnetic sensor chips 103 and 105 with ease.

The present embodiment is designed such that the bonding step and wiring step are performed respectively on the stages 107 and 109 whose surfaces 107a and 109a are held horizontally. It is possible to modify the present embodiment such that after the bonding step is performed so as to bond the magnetic sensor chips 103 and 105 onto the stages 107 and 109 respectively, the wiring step is performed on the stages 107 and 109.

When the same device is used to perform both of the bonding step and wiring step, it is preferable that the bonding step and wiring step be performed on the stage 107, then, the bonding step and wiring step are performed on the stage 109. In this case, it is possible to reduce the number of times for inclining (or moving) the thin metal plate 125; hence, it is possible to improve the manufacturing efficiency regarding the magnetic sensor 150.

The present embodiment describes such that in the bonding step, the magnetic sensor chips 103 and 105 are bonded onto the surfaces 107a and 109a of the stages 107 and 109 by use of silver paste. Of course, the present embodiment is not necessarily limited in such a way. That is, the present embodiment simply requires the magnetic sensor chips 103 and 105 to be bonded onto the stages 107 and 109.

Figure 25:
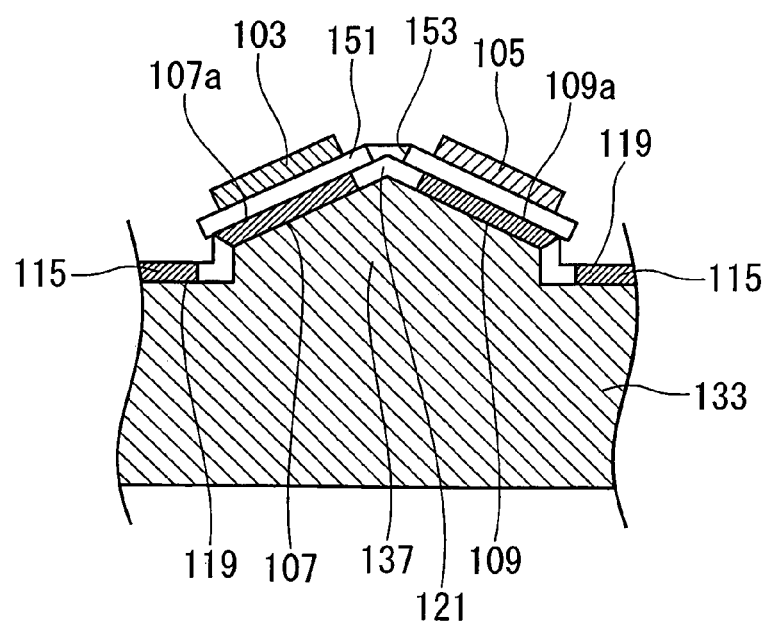
FIG. 25 is an enlarged cross-sectional view for explaining a bonding step in which magnetic sensor chips are bonded onto stages of a lead frame, which is partially modified, by use of a die-bonding tape.
Figure 26:
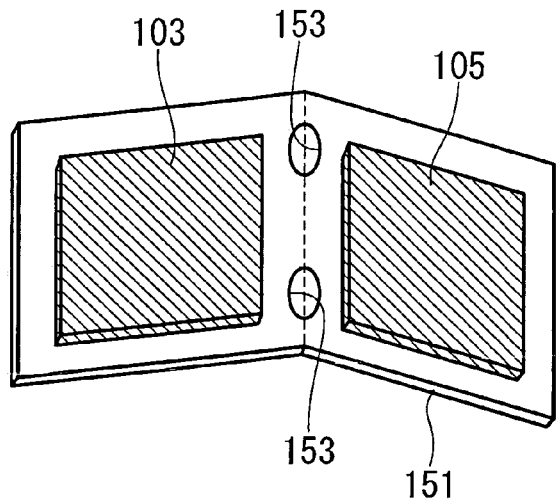
FIG. 26 is a perspective view showing the die-bonding tape shown in FIG. 25.

For example, it is possible to use an adhesive sheet, i.e., a die-bonding tape 151 (see FIGS. 25 and 26), for bonding the magnetic sensor chips 103 and 105 onto the stages 107 and 109 in the bonding step. In particular, a single adhesive sheet, i.e., the die-bonding tape 151 shown in FIG. 26, can be used for the two stages 107 and 109, wherein the two magnetic sensor chips 103 and 105 are adhered to the surface of the die-bonding tape 151.

In the die-bonding tape 151, a pair of cutouts 153 are formed in an intermediate area between the magnetic sensor chips 103 and 105, wherein they are formed with a prescribed distance therebetween in a direction perpendicular to the stage arrangement direction. When the die-bonding tape 151 is arranged to positionally match the stages 107 and 109, the stage interconnection portions 121 are respectively engaged with the cutouts 153. That is, the cutouts 153 play a role of establishing positioning between the die-bonding tape 151 and the stages 107 and 109 when the die-bonding tape 151 is arranged to positionally match the stages 107 and 109.

Incidentally, it is preferable that the magnetic sensor chips 103 and 105 be bonded onto the surface of the die-bonding tape 151 before the bonding step.

Even though the stages 107 and 109 have different inclination angles, it is possible to easily arrange the magnetic sensor chips 103 and 105 onto the stages 107 and 109 by merely positioning the die-bonding tape 151 in conformity with the surfaces 107a and 109a of the stages 107 and 109. In addition, it is possible to precisely set up the mutual positioning with respect to the magnetic sensor chips 103 and 105, which are to be attached onto the stages 107 and 109.

Therefore, it is possible to realize a further high precision with respect to the magnetic sensor 150. As the magnetic sensor chips 103 and 105 can be easily arranged onto the stages 107 and 109, it is possible to improve the manufacturing efficiency regarding the magnetic sensor chip 150.

The aforementioned modification allows the die-bonding tape 151 and the magnetic sensor chips 103 and 105 to be precisely positioned in connection with the stages 107 and 109 by use of the cutouts 153 and the stage interconnection portions 121. This eliminates the necessity of inclining (or moving) the thin metal plate 125 relative to the first instrument 133 in the bonding step.

The present embodiment describes that the stage inclining step and the lead processing step are performed after the preparation of the lead frame 101. Of course, the present embodiment is not necessarily limited in such a way. That is, it is possible to simultaneously perform them together with the preparation of the lead frame 101.

The present embodiment described such that the surfaces 117c of the tip ends 117a of the leads 117, which are appropriately bent in the lead processing step, are disposed along the surfaces 107a and 109a of the stages 107 and 109. The present embodiment is not necessarily limited in such a way. That is, the surfaces 117c can be disposed to be higher than the surfaces 107a and 109a, wherein it is preferable that the surfaces 117c be inclined in parallel with the surfaces 107a and 109a.

In the above, it is possible to reduce the distances between the surfaces 117c of the tip ends 117 of the leads 117 and the surfaces of the magnetic sensor chips 103 and 105 attached onto the stages 107 and 109; hence, it is possible to further reduce the lengths of the wires.

Figure 27:
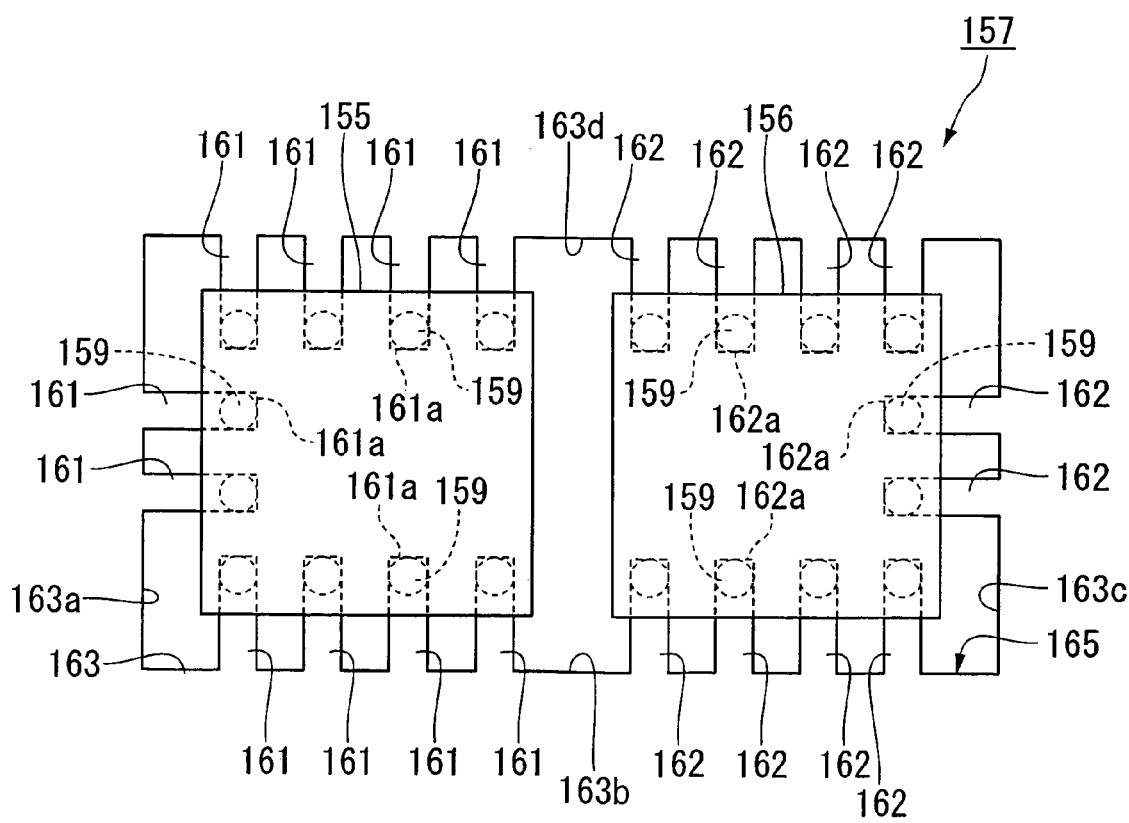
FIG. 27 is a plan view showing the structure of a lead frame that is modified compared with the lead frame shown in FIG. 13.
Figure 28:
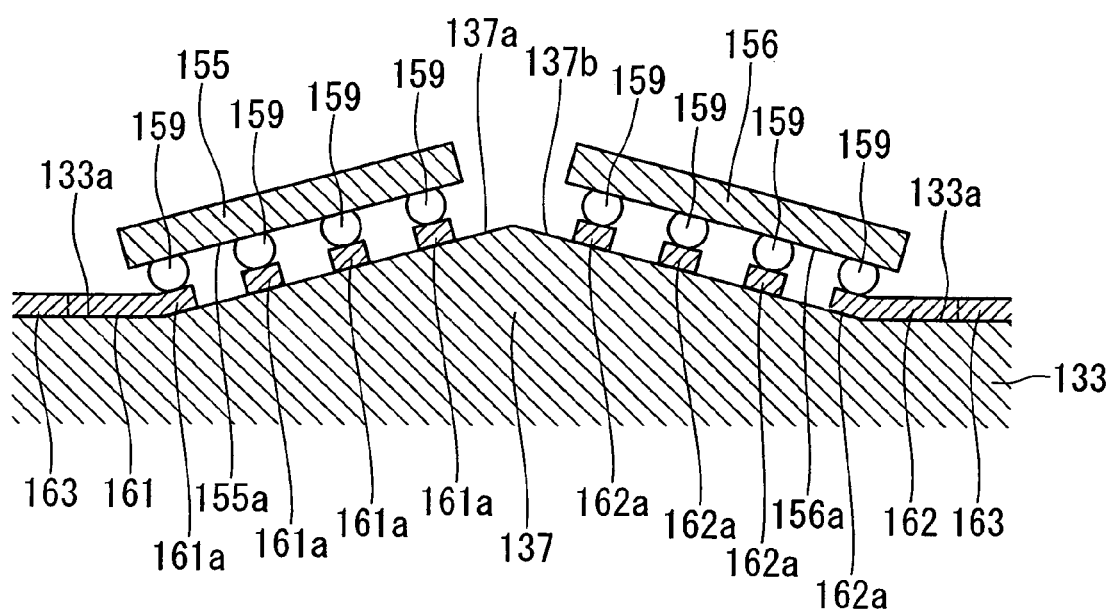
FIG. 28 is a cross-sectional view showing magnetic sensor chips attached onto the lead frame of FIG. 27.

The present embodiment can be modified as shown in FIGS. 27 and 28, wherein parts corresponding to the aforementioned parts (i.e., constituent parts of the lead frame 101 and the magnetic sensor 150) are designated by the same reference numerals; hence, the detailed description will be omitted.

That is, in the modification shown in FIGS. 27 and 28, there are provided a pair of magnetic sensor chips 155 and 156 in which projection electrodes are formed on pads formed on the surfaces thereof. The overall structure of a magnetic sensor according to this modification can be constituted to realize a so-called surface-mount-type package such as a flip chip and a chip size package (CSP). Specifically, solder balls (serving as projection electrodes) 159, each of which is produced by forming solder in a spherical shape, are formed on backsides 155a and 156a of the magnetic sensor chips 155 and 156, which are arranged in connection with a lead frame 157. The solder balls 159 are electrically connected to leads 161 and 162 of the lead frame 157.

A plurality of lead frames, each corresponding to the lead frame 157 having the two magnetic sensor chips 155 and 156, are formed on a thin metal plate, wherein the lead frame 157 is constituted by a rectangular frame portion 163 having a rectangular shape in a plan view, and a frame 165 having a plurality of leads 161 and 162, which inwardly project from four sides 163a to 163d of the rectangular frame portion 163. Tip ends 161a and 162a of the leads 161 and 162 are respectively arranged to positionally match the solder balls 159 of the magnetic sensor chips 155 and 156.

In the manufacturing of a magnetic sensor using the aforementioned lead frame 157, there are provided a lead frame 157 and two magnetic sensor chips 155 and 156 in a preparation step; then, the lead frame 157 is subjected to press working so as to incline surfaces of tip ends 161a and 162a of leads 161 and 162 with respect to the planar surface of the rectangular frame portion 163 at prescribed angles in a lead processing step. In this condition, the surfaces of the tip ends 161a of the leads 161 for arranging the solder balls 159 for the magnetic sensor chip 155 are inclined with respect to the surfaces of the tip ends 162a of the leads 162 for arranging the solder balls 159 for the magnetic sensor chip 156.

As described before in conjunction with the second embodiment, in the lead processing step, the intermediate portions of the leads 161 and 162 are respectively bent so that the tip ends are disposed in the same plane while they are inclined with respect to the planar surface of the rectangular frame portion 163.

After the completion of the lead processing step, the lead frame 157 is mounted on the first instrument 133 (see FIG. 18). In this condition, the rectangular frame portion 163 is arranged on the surface 133a of the first instrument 133, wherein the tip ends 161a and 162a of the leads 161 and 162 are respectively arranged on the inclined surfaces 137a and 137b of the stage support portion 137, so that the tip ends 161a and 162a of the leads 161 and 162 are maintained at prescribed positions in inclined states.

In the aforementioned condition, the solder balls 159 of the magnetic sensor chips 155 and 156 are bonded onto the tip ends 161a and 162a of the leads 161 and 162 in a bonding-wiring step. In the bonding-wiring step, the surfaces of the leads 161, which are originally inclined with respect to the rectangular frame portion 163 in a prescribed direction, are held horizontally and are then connected to the magnetic sensor chip 155. Thereafter, the lead frame 157 is inclined (or moved) together with the first instrument 133, so that the surfaces of the leads 162, which are originally inclined with respect to the rectangular frame portion 163 in another direction, are held horizontally and are then connected to the magnetic sensor chip 156.

Thereafter, a molding step is performed similarly to the second embodiment so as to form a resin mold package for embedding the magnetic sensor chips 155 and 156 in a resin. Lastly, the rectangular frame portion 163 is cut out so as to individually isolate the leads 161 and 162, thus completing the production of a magnetic sensor (not shown).

In the manufacturing method of the magnetic sensor using the lead frame 157 described above, similarly to in the second embodiment, a plurality of leads 161 and 162 are disposed in inclination directions of the stages before the bonding-wiring step. This reliably prevent the tip ends 161a and 162a of the leads 161 and 162 from being unexpectedly moved relative to the rectangular frame portion 163 in the condition in which the solder balls 159 of the magnetic sensor chips 155 and 156 are bonded onto the leads 161 and 162. That is, it is possible to prevent stress from being applied to the solder balls 159, which serve as connected portions between the magnetic sensor chips 155 and 156 and the tip ends 161a and 162a of the leads 161 and 162; hence, it is possible to reliably prevent the solder balls 159 from being unexpectedly separated from the tip ends 161a and 162a of the leads 161 and 162. In short, it is possible to avoid the occurrence of electric connection failure between the magnetic sensor chips 155 and 156 and the leads 161 and 162.

The aforementioned modification shown in FIGS. 27 and 28 are advantageous in that the magnetic sensor chips 155 and 156 can be completely connected to the leads 161 and 162 by simply arranging the magnetic sensor chips 155 and 156 on the lead frame 157. Therefore, compared with the second embodiment, this modification does not require a bonding step to be independently performed. Thus, it is possible to further improve the manufacturing efficiency regarding magnetic sensors.

In addition, all the tip ends 161a and 162a of the leads 161 and 162 and the rectangular frame portion 163 are collectively supported by the first instrument 133. In the bonding-wiring step, it is possible to reliably prevent the leads 161 and 162 from being deformed; hence, it is possible to perform bonding with respect to the magnetic sensor chips 155 and 156 in a stable manner, and it is possible to electrically connect the magnetic sensor chips 155 and 156 to the leads 161 and 162 in a stable manner. This reliably avoids the occurrence of electric connection failure between the magnetic sensor chips 155 and 156 and the leads 161 and 162. It is possible to maintain the magnetic sensor chips 155 and 156 at prescribed inclination angles. As a result, it is possible to produce a high-precision magnetic sensor using the lead frame 157.

Furthermore, when the magnetic sensor including the magnetic sensor chips 155 and 156 is encapsulated in a chip size package, this modification is advantageous in that the magnetic sensor can be downsized in dimensions and is very difficult to destroy in comparison with a package of the second embodiment including the magnetic sensor chips 155 and 156.

In the modification, the magnetic sensor chips 155 and 156 have the solder balls 159. Of course, the present embodiment is not necessarily limited in such a way, wherein it is simply required that projection electrodes are formed on the backsides 155a and 156a of the magnetic sensor chips 155 and 156 and are electrically connected to the leads 161 and 162.

As described above, the frame 111 has a rectangular frame portion 115 or 157 having a rectangular shape in a plan view. Of course, the present embodiment is not necessarily limited in such a way, wherein it is simply required that the frame 111 has some frame structure allowing the leads 117 and 119 to inwardly project therefrom. That is, the frame structure can be formed in various shapes such as a circular shape in a plan view and a three-dimensional shape, for example.

The present embodiment describes that the stages 107 and 109 are each formed in a rectangular shape in a plan view, which is not restricted, wherein it is simply required that the surfaces 107a and 109a are appropriately shaped to allow the magnetic sensor chips 103 and 105 to be bonded thereto. That is, it is possible to form each of the stages 107 and 109 in a circular shape or an elliptical shape in a plan view. Alternatively, each of the stages 107 and 109 can be formed to have holes running therethrough in the thickness direction or formed in a mesh-like shape.

The present embodiment describes that all the magnetic sensor chips (103, 105, 155, and 156), the leads (117, 119, 161, and 162), and the stages (107 and 109) are integrally fixed inside of the resin mold package (149), which is not a restriction. Instead, it is possible to use a box-like package having an internal space for collectively storing and integrally fixing the magnetic sensor chips, leads, and stages.

As described heretofore, the present embodiment is adapted to a magnetic sensor for detecting magnetism directions in a three-dimensional space, which is not a restriction. That is, the present embodiment can be adapted to any types of physical quantity sensors for measuring bearing and direction in a three-dimensional space. Of course, it can be adapted to an acceleration sensor including acceleration sensor chips for detecting magnitude and direction of acceleration.

As the present invention is described by way of examples with reference to the accompanying drawings, various modifications and design changes can be embraced within the scope of the invention.

What is claimed is:

1. A physical quantity sensor comprising:
   a plurality of leads whose base portions are arranged in a same plane; and
   at least one physical quantity sensor chip in which a plurality of electrode pads are formed and which is inclined to the plane,
   wherein the plurality of electrode pads are disposed in an inclination direction of the physical quantity sensor chip and are respectively connected to the plurality of leads via a plurality of wires whose lengths substantially match distances between the electrode pads and the leads, wherein tip ends of the leads where the wires are bonded respectively differ in height from one another in conformity with the positions of the electrode pads attached to the inclined sensor chip.

2. A physical quantity sensor according to claim 1, wherein tip ends of the leads, which are subjected to wire bonding, have different heights substantially matching heights of the electrode pads arranged on the physical quantity sensor that is inclined.

3. The physical quantity sensor according to claim 1, wherein tip end of the leads, which are subjected to wire bonding, have different heights lower than the electrode pads arranged on the physical quantity sensor chip that is inclined.

4. A physical quantity sensor according to claim 1, wherein the physical quantity sensor chip is mounted on a stage that is inclined about an axial line drawn in relation to a lead frame.

5. A manufacturing method of a physical quantity sensor that comprises a plurality of leads whose base portions are arranged in a same plane, and at least one physical quantity sensor chip in which a plurality of electrode pads are formed and which is inclined to the plane, wherein the plurality of electrode pads are disposed in an inclination direction of the physical quantity sensor chip and are respectively connected to the plurality of leads via a plurality of wires whose lengths substantially match distances between the electrode pads and the leads, said manufacturing method comprising the steps of:
   forming a lead frame including a frame portion, at least one stage being surrounded by the leads, and a plurality of interconnection portions for interconnecting the stage to the frame portion;
   bonding the physical quantity sensor chip onto the stage;
   performing wire bonding to connect the leads to the electrode pads on the physical quantity sensor chip mounted on the stage by use of the wires; and
   inclining the stage together with the physical quantity sensor chip at a prescribed angle to the frame portion while deforming the interconnection portions, wherein tip ends of the leads where the wires are bonded respectively differ in height from one another in conformity with the positions of the electrode pads attached to the inclined sensor chip.

6. The manufacturing method of a physical quantity sensor according to claim 5, wherein tip ends of the leads, which are subjected to the wire bonding, have different heights substantially matching heights of the electrode pads arranged on the physical quantity sensor that is inclined.

7. The manufacturing method of a physical quantity sensor according to claim 5, wherein the wire bonding is performed using the wires in a moving direction of the electrode pads on the physical quantity sensor chip that is inclined.

8. The manufacturing method of a physical quantity sensor according to claim 5, wherein the physical quantity sensor chip is inclined together with the stage before the wire bonding, and wherein the leads are processed such that heights of tip ends thereof are changed in conformity with positions of the electrode pads as the physical quantity sensor chip is inclined.

9. A manufacturing method of a physical quantity sensor that comprises a plurality of leads whose base portions are arranged in a same plane, and at least one physical quantity sensor chip in which a plurality of electrode pads are formed and which is inclined to the plane, wherein the plurality of electrode pads are disposed in an inclination direction of the physical quantity sensor chip and are respectively connected to the plurality of leads via a plurality of wires whose lengths substantially match distances between the electrode pads and the leads, said manufacturing method comprising the steps of:
   forming a lead frame including a frame portion, at least one stage being surrounded by the leads, and a plurality of interconnection portions for interconnecting the stage to the frame portion;
   bonding the physical quantity sensor chip onto the stage;
   inclining the stage together with the physical quantity sensor chip at a prescribed angle to the frame portion while deforming the interconnection portions; and
   performing wire bonding to connect the leads to the electrode pads on the physical quantity sensor chip mounted on the stage by use of the wires, wherein tip ends of the leads where the wires are bonded respectively differ in height from one another in conformity with the positions of the electrode pads attached to the inclined sensor chip.

10. The manufacturing method of a physical quantity sensor according to claim 9, wherein tip ends of the leads, which are subjected to the wire bonding, have different heights substantially matching heights of the electrode pads arranged on the physical quantity sensor that is inclined.

11. The manufacturing method of a physical quantity sensor according to claim 9, wherein after the lead frame is formed and before the physical quantity sensor chip is inclined, the leads are processed such that heights of tip ends thereof are changed in conformity with positions of the electrode pads on the physical quantity sensor chip that is inclined.

* * * * *